US011141875B1

(12) United States Patent
Weinschenk

(10) Patent No.: US 11,141,875 B1
(45) Date of Patent: *Oct. 12, 2021

(54) AUTOMATED METHOD AND SYSTEM FOR LUMBER ANALYSIS

(71) Applicant: Wein Holding LLC, Rochester, MN (US)

(72) Inventor: Steven R. Weinschenk, Rochester, MN (US)

(73) Assignee: Wein Holding LLC, Rochester, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/808,323

(22) Filed: Mar. 3, 2020

Related U.S. Application Data

(63) Continuation of application No. 15/408,374, filed on Jan. 17, 2017, now Pat. No. 10,580,126.

(Continued)

(51) Int. Cl.
| | |
|---|---|
| *G06K 9/00* | (2006.01) |
| *B27B 31/06* | (2006.01) |
| *B07C 5/342* | (2006.01) |
| *B07C 5/14* | (2006.01) |
| *G06F 30/13* | (2020.01) |
| *B27B 1/00* | (2006.01) |
| *B27B 31/04* | (2006.01) |
| *G06T 7/00* | (2017.01) |

(Continued)

(52) U.S. Cl.
CPC ............ *B27B 31/06* (2013.01); *B07C 5/14* (2013.01); *B07C 5/342* (2013.01); *B27B 1/007* (2013.01); *B27B 25/00* (2013.01); *B27B 31/04* (2013.01); *G06F 30/13* (2020.01); *G06T 7/001* (2013.01); *G06T 7/0006* (2013.01); *H04N 5/247* (2013.01); *G06T 2207/30161* (2013.01)

(58) Field of Classification Search
None
See application file for complete search history.

(56) References Cited

U.S. PATENT DOCUMENTS

| | | | | |
|---|---|---|---|---|
| 4,541,766 A | * | 9/1985 | Dahl | B65G 1/0442 |
| | | | | 414/277 |
| 6,358,352 B1 | * | 3/2002 | Schmidt | B07C 5/14 |
| | | | | 144/344 |

(Continued)

*Primary Examiner* — Randolph I Chu
(74) *Attorney, Agent, or Firm* — Charles A. Lemaire; Jonathan M. Rixen; Lemaire Patent Law Firm, P.L.L.C.

(57) ABSTRACT

A system that includes a computer processor having a plurality of input data devices, a plurality of output data devices, and a plurality of sensors; and a mechanical assembly integrated with the computer processor to reposition a piece of wood lumber based on software code executing in the computer processor. In some embodiments, the system performs a method that includes eliciting and receiving into the computer processor data parameters from a first human user; obtaining incoming data points about the lumber from the plurality of sensors; processing and storing the data parameters; comparing the incoming data points to the data parameters to obtain comparison results; and, based on the comparison results, (1) rejecting the lumber to a preprogrammed position, (2) feeding the lumber into a saw assembly as positioned, or (3) repositioning the lumber to a more optimal position prior to feeding the lumber to the saw assembly.

20 Claims, 12 Drawing Sheets

Related U.S. Application Data

(60) Provisional application No. 62/388,048, filed on Jan. 14, 2016.

(51) Int. Cl.
  *H04N 5/247*  (2006.01)
  *B27B 25/00*  (2006.01)

(56) References Cited

U.S. PATENT DOCUMENTS

| | | | | |
|---|---|---|---|---|
| 8,231,299 B2 * | 7/2012 | Klauer | ............... | B65G 17/00 |
| | | | | 403/23 |
| 8,960,244 B1 * | 2/2015 | Aylsworth | ............. | B65G 59/02 |
| | | | | 144/245.5 |
| 10,493,636 B1 * | 12/2019 | Weinschenk | ......... | B25J 15/0633 |
| 10,525,587 B2 * | 1/2020 | Aylsworth | ............ | B25J 15/0052 |
| 10,580,126 B1 * | 3/2020 | Weinschenk | ............ | B07C 5/14 |
| 2005/0013472 A1 * | 1/2005 | Gauthier | ............ | G05B 19/4183 |
| | | | | 382/141 |
| 2007/0220825 A1 * | 9/2007 | Davis | ................ | B27G 1/00 |
| | | | | 52/847 |
| 2008/0053928 A1 * | 3/2008 | Klauer | ................ | A47B 47/021 |
| | | | | 211/49.1 |
| 2008/0140248 A1 * | 6/2008 | Moore | ................ | G01N 33/46 |
| | | | | 700/223 |
| 2008/0184856 A1 * | 8/2008 | Koskovich | ............ | B27B 5/207 |
| | | | | 83/56 |
| 2008/0243270 A1 * | 10/2008 | Jones | .................... | G01B 21/30 |
| | | | | 700/51 |
| 2008/0283151 A1 * | 11/2008 | Floyd | .................... | G01N 29/07 |
| | | | | 144/356 |
| 2014/0138290 A1 * | 5/2014 | Saastamo | ............... | B65G 39/00 |
| | | | | 209/552 |
| 2014/0238546 A1 * | 8/2014 | Barker | ................. | B23Q 17/20 |
| | | | | 144/357 |
| 2014/0290456 A1 * | 10/2014 | Brooks | ................. | B27G 1/00 |
| | | | | 83/98 |
| 2016/0103115 A1 * | 4/2016 | Hamby | ................. | G01N 33/46 |
| | | | | 73/618 |
| 2016/0153917 A1 * | 6/2016 | Couturier | ........... | G01N 21/8986 |
| | | | | 356/445 |
| 2017/0057113 A1 * | 3/2017 | Aylsworth | ............. | B27B 31/04 |
| 2017/0217022 A1 * | 8/2017 | Aylsworth | ............. | B65G 61/00 |
| 2020/0324432 A1 * | 10/2020 | Aylsworth | ............. | B65G 59/02 |

\* cited by examiner

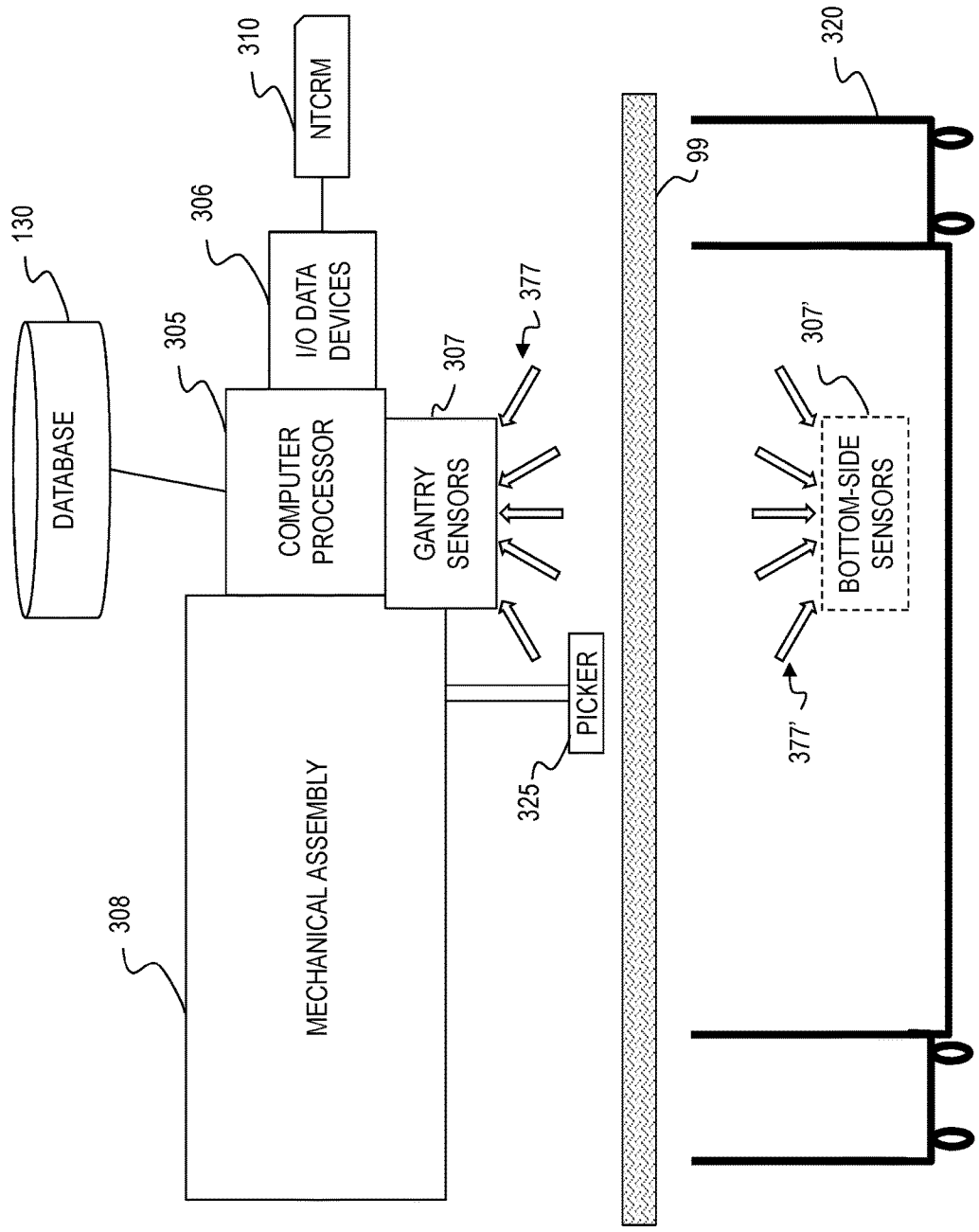

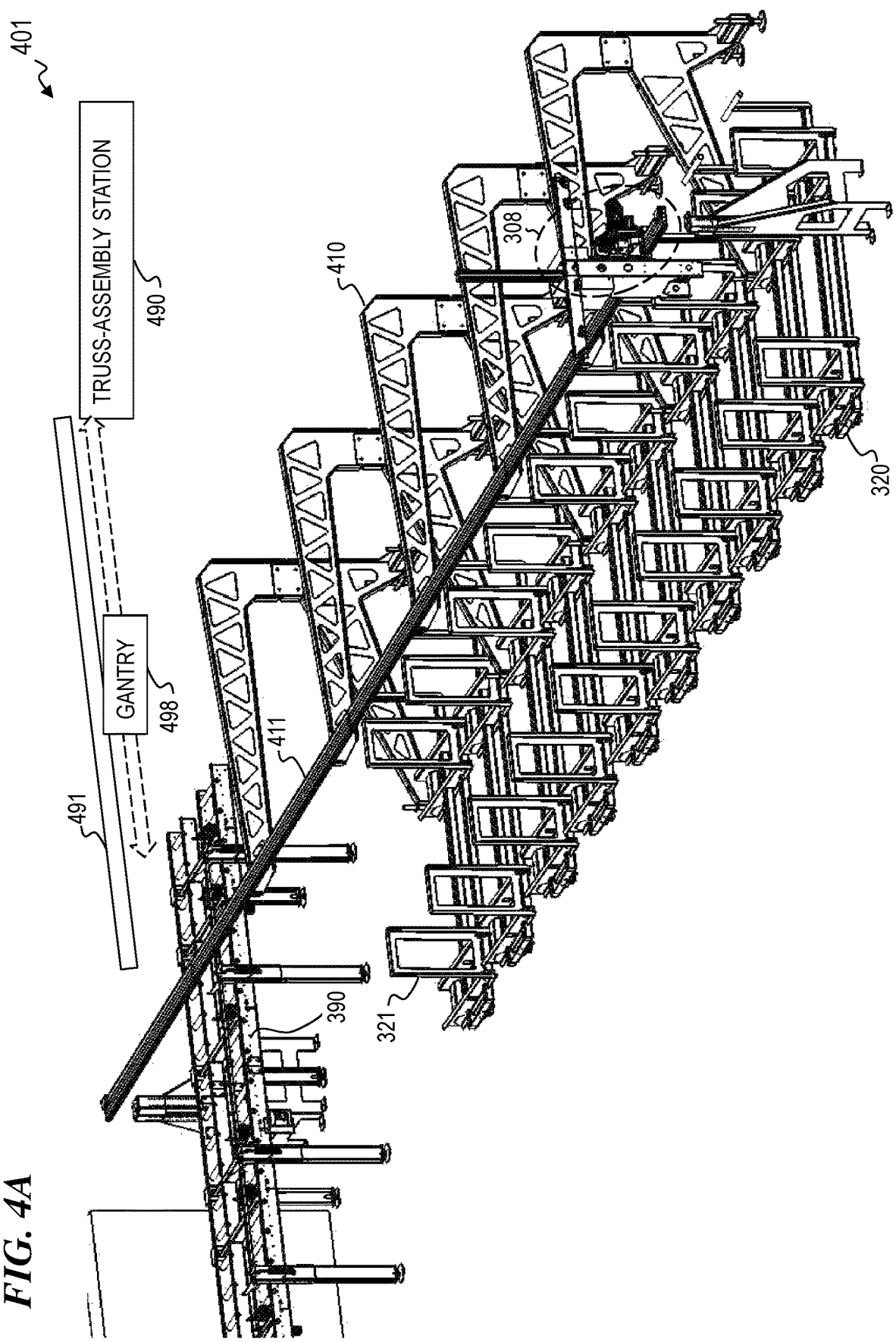

AUTOMATED METHOD AND SYSTEM FOR LUMBER ANALYSIS

CROSS-REFERENCE TO RELATED APPLICATION

This application is a continuation of U.S. patent application Ser. No. 15/408,374, filed Jan. 17, 2017 by Steven R. Weinschenk and titled "Automated system and method for lumber analysis" (which issued as U.S. Pat. No. 10,580,126 on Mar. 3, 2020), which claims priority benefit, under 35 U.S.C. § 119(e), of U.S. Provisional Patent Application No. 62/388,048, filed Jan. 14, 2016 by Steven Weinschenk, titled "Automated system and method to enhance safety and strength of wood truss structures," each of which is incorporated herein by reference in its entirety.

This invention is related to:

U.S. Provisional Patent Application 62/144,859 filed Apr. 8, 2015 by Steven Weinschenk, titled "Digital projection system and method for workpiece assembly";

U.S. patent application Ser. No. 15/093,732 filed Apr. 7, 2016 by Steven R. Weinschenk et al., titled "Digital projection system and method for workpiece assembly" (which issued as U.S. Pat. No. 10,210,607 on Feb. 9, 2019); which are both incorporated herein by reference in their entirety.

FIELD OF THE INVENTION

The present invention relates to devices and methods to workpiece assembly, and in particular to automated systems and methods for lumber analysis, sorting, adjustment, and sawing for workpiece assembly, such as the assembly of wooden roof trusses, pre-assembled walls, and the like. Some embodiments organize each incoming stack of lumber in one of a plurality of vertically spaced apart bunks, one on top of another, and provide a gantry that picks a selected board from the stack of lumber on a selected bunk, and moves the board in a direction generally parallel to the long axis of the board from the bunk to one of a plurality of processing stations, wherein the plurality of processing stations includes a flipping station and/or a sawing station.

BACKGROUND OF THE INVENTION

One problem with today's conventional technology is that, when manually loading wood into the infeed systems, the human operator needs to determine how to orient the wood, which increases the cost of labor when manufacturing structures using wood boards (lumber). As used herein, "crook" is a lumber feature or defect where the widest faces of the piece of lumber are substantially planar but there is a curvature along the length of the narrower faces of the piece of lumber. The "crown" is the convex one of the narrower faces of the piece of lumber with a crook. The crown should be orientated to optimize with the wood saw equipment. Certain wood trusses and pre-assembled walls are more secure if the crown of the wood is oriented correctly (both when the board is loaded into a sawing station, and when the cut board is assembled into a truss, a pre-assembled wall, or the like). Conventional automated or partially automated systems are unable to determine and/or distinguish the crown of the lumber.

U.S. Pat. No. 6,170,163 to Robert A. Bordignon et al. titled "METHOD OF ASSEMBLING COMPONENTS OF AN ASSEMBLY USING A LASER IMAGE SYSTEM," issued Jan. 9, 2001, and is incorporated herein by reference. In U.S. Pat. No. 6,170,163 Bordignon et al. describe a method of assembling components of an assembly, such as the components of a truss, using a laser imaging system in combination with assembly jigs. The jigs may be slidably mounted on an assembly table wherein the jigs include laser alignment indicia on a top surface of the jigs spaced a predetermined distance from a side surface of the jigs. The method includes projecting an enlarged laser generated outline of at least a portion of the components to be assembled which is spaced laterally from an outline or template of the components in the assembled position a distance equal to the distance between the laser alignment indicia and the side surface of the jigs and spaced vertically a distance equal to the distance between the indicia and the work surface. The jigs are then moved on the work surface to align the laser alignment indicia with the enlarged outline and affixed relative to the work surface. Finally, the components are assembled on the work surface in generally abutting relation with the side surfaces of the jigs and assembled. Where the assembly method of this invention is used for assembling trusses, the laser generated outline may be used to orient the truss planks.

U.S. Pat. No. 7,463,368 to Jarrad V. Morden et al. titled "LASER PROJECTION SYSTEM, INTELLIGENT DATA CORRECTION SYSTEM AND METHOD," issued Dec. 9, 2008, and is incorporated herein by reference. In U.S. Pat. No. 7,463,368 Morden et al. describe a laser projection system, intelligent data correction system and method which corrects for differences between the as-built condition and the as-designed condition of a workpiece which includes determining the as-built condition of a workpiece with a digitizer scanner and modifying data of the as-built condition or the data of a laser projection based upon the data received from the digitizer scanner of the as-built condition. A preferred intelligent data correction system includes metrology receivers fixed relative to the digitizer scanner and the workpiece and a metrology transmitter to determine the precise location and orientation of the digitizer scanner relative to the workpiece.

U.S. Pat. No. 7,621,053 to Edward S. Bianchin titled "ASSEMBLY APPARATUS," issued Nov. 24, 2009, and is incorporated herein by reference. In U.S. Pat. No. 7,621,053 Bianchin describes an assembly apparatus for assembling components including a work surface, a laser projector, a computer controlling the laser projector to protect a laser image on the work surface, and an ejector lifting a completed assembly from the work surface having a retro-reflective surface within a field of view of the laser projector when the ejector is lifted, such that the laser projector scans the retro-reflective surface and the computer determines at least one of the number of completed assemblies made and the time required to make the assembly.

United States Patent Publication 2010/0201702 of Franik et al. published Aug. 12, 2010 with the title "DIGITAL IMAGE PROJECTION LUMINAIRE SYSTEMS," and is incorporated herein by reference. In Patent Publication 2010/0201702 Franik et al. describe improvements to digital imagine projection systems and for seamless blending of images projected from a plurality of digital image projectors to create combined images from multiple projectors where the user is provided with independent control of the blend area and of independent control of image parameters within said variable blend area such as brightness, contrast, individual color intensity and gamma correction.

U.S. Pat. No. 8,079,579 to Fredrickson et al. titled "Automatic truss jig setting system," issued Dec. 20, 2011, and is incorporated herein by reference. In U.S. Pat. No. 8,079,579

Fredrickson et al. describe an automatic truss jig setting system that includes a table including a plurality of segments with a side edge of adjacent segments defining a slot. At least one pin assembly, and optionally a pair of pin assemblies, is movable independently of each other along the slot. Movement apparatus is provided for independently moving the pin assemblies along the slot. Each of the side edges of the segments associated with the slot defines a substantially vertical plane with a zone being defined between the substantially vertical planes of the side edges, and the movement apparatus is located substantially outside of the zone of the slot. The invention may optionally include a system for handling the obstruction of pin assembly movement, and a system for keeping track of the position of the pin assembly when the pin assembly has encountered an obstruction.

U.S. Pat. No. 8,782,878 to Jarrad V. Morden et al., titled "FASTENER AUTOMATION SYSTEM," issued Jul. 22, 2014, and is incorporated herein by reference. In U.S. Pat. No. 8,782,878, Morden et al. describe a fastener automation system for assembly of fasteners to a substrate, which includes a projection system for projecting an image on a substrate of a predetermined location of a correct fastener to be installed in the substrate and data relating to the correct fastener and the substrate, and a computer operably associated with the projection system storing data regarding the correct fastener and the predetermined location on the substrate where the correct fastener is to be installed. An automated method of installing a fastener in a substrate at a predetermined location includes using a projector system to identify a predetermined location for installation of a correct fastener to the substrate, collecting data regarding the correct fastener installation at the predetermined location and storing the data in a computer, and installing the correct fastener in the substrate at the predetermined location based upon the data.

United States Patent Publication 2008/0297740 of Huynh et al. published Dec. 4, 2008 with the title "Projection system and method of use thereof," and is incorporated herein by reference. In Patent Publication 2008/0297740 Huynh et al. describe a projection system and method of use thereof, wherein a computer in electrical communication with at least one projector projects a layout, preferably onto a floor projection surface utilizing short throw lenses, wherein the layout preferably comprises a grid and indicia relating to an exhibitor.

U.S. Pat. No. 8,919,001 to Le Mer et al. titled "METHOD AND SYSTEM FOR HELPING TO POSITION A COMPONENT ON A STRUCTURAL ELEMENT," issued Dec. 30, 2014, and is incorporated herein by reference. In U.S. Pat. No. 8,919,001 Le Mer et al. describe a method for helping to position a component on the wall of a structural element, including the steps: elaborating an image to be projected on the wall, from a virtual model of the structure and from the positioning of a projector with respect to the structure, and an additional motif providing positioning information of the piece with respect to the direction normal to the wall, projecting the image on the structural element by means of the projector; placing the base of the piece inside an outline of the image projected on the wall; and, while keeping contact between the piece and the structural element, modifying the positioning of the piece with respect to the direction normal to the wall, until the predefined set of points of the piece coincides with the motif.

U.S. Pat. No. 8,960,244 to Aylsworth et al. titled "AUTOMATED LUMBER RETRIEVAL AND DELIVERY," issued Feb. 24, 2015, and is incorporated herein by reference. In U.S. Pat. No. 8,960,244 Aylsworth et al. describe an automated lumber handling system that laser-scans the top profile of multiple stacks of lumber, each of which contain boards of a unique size. Based on the scanned profiles, the system determines the order in which individual boards from a chosen stack should be transferred to a numerically controlled saw. The saw cuts the boards to proper size, and in the proper sequence to facilitate orderly assembly of a roof truss or prefabricated wall. In some examples, the system lifts individual boards by driving two retractable screws, or some other piercing tool, down into the upward facing surface of the board. A track mounted cantilever, holding the screws and a laser unit, translates over the lumber stacks to retrieve and deliver individual boards and, while doing so, the laser repeatedly scans the stacked lumber profiles on-the-fly to continuously update the profiles. The open cantilever design facilitates replenishing the stacks of lumber.

Chinese Patent Publication CN 202899636 U published Apr. 24, 2013 with the title "Discrete assembly device for large-span rectangular spatially warped tube truss," and is incorporated herein by reference. This Chinese Patent Publication CN 202899636 describes a discrete assembly device for a large-span rectangular spatially warped tube truss. The device consists of a base, two supporting tubes fixedly connected to the two sides of the base, and tube brackets fixedly connected to the tops of the supporting tubes, wherein grooves of which the diameter is matched with that of a lower chord of an assembly section truss are formed on the tube brackets. The on-site assembly difficulty of the large-span rectangular spatially warped truss is reduced, assembly accuracy and speed are greatly improved, and construction materials are saved.

There is a need in the art for automated systems and methods for lumber analysis, sorting, adjustment, and sawing for workpiece assembly, such as the assembly of wooden roof trusses, pre-assembled walls, and the like.

SUMMARY OF THE INVENTION

In some embodiments, the present invention provides a method and associated system that includes a computer processor, wherein the computer processor includes: a plurality of input data devices, a plurality of output data devices, and a plurality of sensors, and wherein the system further includes a mechanical assembly integrated with the computer processor to analyze the geometry of a piece of wood or lumber and, if necessary, reposition the piece and convey the piece to a saw or to a reject station, based on software code executing in the computer processor. Some embodiments organize each incoming stack of lumber in one of a plurality of vertically spaced apart bunks, one on top of another, and provide a gantry that picks a selected board from the stack of lumber on a selected bunk, and moves to board in a direction generally parallel to the long axis of the board from the bunk to one of a plurality of processing stations, wherein the plurality of processing stations includes a flipping station and/or a sawing station. Organizing the lumber bunks in vertical assemblies greatly reduces the footprint of the overall system, thus making more efficient use of valuable factory space and reducing costs. Using the present invention, one can buy lower-grade lumber and sort the boards to obtain suitable and usable pieces for a given end product, thus reducing cost and improving quality of the end product.

In some embodiments, the present invention provides a system and associated method that operates on a computer processor having a plurality of input data devices, a plurality of output data devices, a plurality of sensors, a database, software code, and a wireless interface, wherein the computer processor is integrated with mechanical components, and wherein the method includes eliciting and receiving into the computer processor data parameters from a first human user; obtaining incoming data points about lumber from the plurality of sensors (e.g., in some embodiments, from optical point distance sensors and/or three-dimensional (3D) machine-vision systems); processing the data parameters to obtain processed data parameters; storing the processed data parameters; comparing the incoming data points from the plurality of sensors to the stored data parameters to obtain comparison results; and, based on the comparison results, (1) directing the mechanical components to reject the wood to a preprogrammed position, (2) directing the mechanical components to feed the lumber into a saw assembly as positioned, or (3) directing the mechanical components to reposition the lumber to a more optimal position prior to feeding the lumber to a saw assembly.

BRIEF DESCRIPTION OF THE FIGURES

FIG. 3A is a side-view schematic diagram of a lumber-analyzer system 301, according to some embodiments of the present invention.

FIG. 4A is a perspective view of a lumber-analyzer system 401, according to some embodiments of the present invention.

COPYRIGHT NOTICE/PERMISSION

Figure 1:
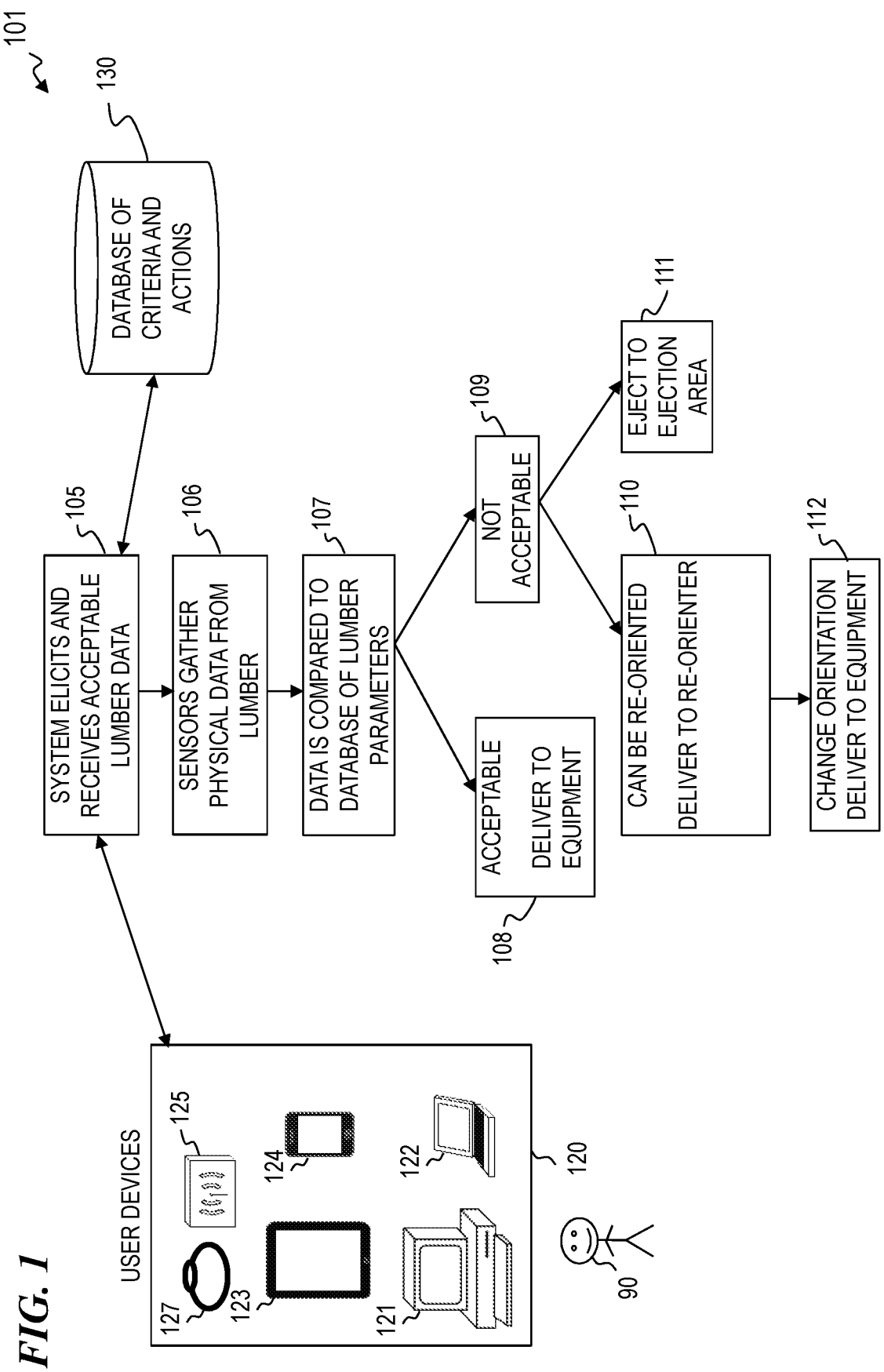
FIG. 1 is a flowchart 101 of one embodiment of the system data processing and software integration of the present invention.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described herein and in the drawings hereto in the attached appendices: Copyright © 2014-2017, Steven R. Weinschenk, All Rights Reserved.

DETAILED DESCRIPTION OF THE INVENTION

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and application publications incorporated by reference in the present application). Further, some embodiments include fewer than all the components described as part of any one of the embodiments described herein.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

Certain marks referenced herein may be common-law or registered trademarks of third parties affiliated or unaffiliated with the applicant or the assignee. Use of these marks is for providing an enabling disclosure by way of example and shall not be construed to limit the scope of the claimed subject matter to material associated with such marks.

As used herein, "crook" is a lumber feature or defect where the widest faces of the piece of lumber are substantially planar but there is a curvature along the length of the narrower faces of the piece of lumber. The "crown" is the convex one of the narrower faces of the piece of lumber with a crook. See FIG. 2A.

As used herein, "bow" is a lumber feature or defect where the narrower faces of the piece of lumber are substantially planar but there is a curvature along the length of the wider faces of the piece of lumber. See FIG. 2B.

As used herein, "twist" is a lumber feature or defect in which there are curvatures across multiple surfaces in the lumber. See FIG. 2C.

As used herein, "wane" is a lumber feature or defect that is characterized by bark or insufficient wood at a corner or along an edge, due to the piece of lumber being cut from an outer edge of the log. See FIG. 2D.

As used herein, "knot" is a lumber feature or defect that is characterized by a separated branch piece or hole in a piece of lumber. See FIG. 2E.

As used herein, "cup" is a lumber feature or defect where there is a curvature across the width of the widest face of the lumber, in which the edges are higher or lower than the center of the piece of lumber. See FIG. 2F.

In some embodiments, the present invention provides a crown-detection system for wood truss lumber infeed saw equipment for enhanced structural support and safety features. In some embodiments, the present invention provides an automated "AutoCurvature System" that detects the crown orientation of the lumber. In some embodiments, after detection by the AutoCurvature System that determines the bow, crown, or twist of a piece of lumber, the AutoCurvature System automatically rejects the wood piece, or the wood piece is reoriented.

In some embodiments, the AutoCurvature System elicits information from the environment or a human operator. In some embodiments, upon receipt of the initial data points, the AutoCurvature System sensors detect the curvature of the lumber piece, and compare the parameters from the detection to an acceptable range of data points pre-programed in the AutoCurvature System (in some such embodiments, the comparison is performed using an algorithm).

In some embodiments, the AutoCurvature System of the present invention determines: (1) that the lumber should be rejected, (2) that the direction of the lumber needs to be changed, or (3) that the lumber should be fed, as situated/oriented, into the saw.

In some embodiments, the sensors of the present invention include a plurality of single-point distance-detecting optical systems. In some embodiments, the sensors also or alternatively include multiple-point optical systems (e.g., in some embodiments, the present invention includes one or more three-dimensional (3D) O3D302 sensors from IFM Efector, Inc., 1100 Atwater Drive, Malvern, Pa. 19355). In some embodiments, the sensors include mechanically driven electrical sensors. In some embodiments, the sensors include monochromatic-camera or color-camera technologies. In some embodiments, the sensors include laser distance detectors. In some embodiments, the sensors include motion detection. In some embodiments, the sensors include temperature detection. In some embodiments, the sensors include weight detection. In some embodiments, the sensors include moisture detection.

FIG. 1 is a flowchart 101 of one embodiment of the system data processing and software integration of the present invention. In some embodiments, at block 105, the system (e.g., system 301 of FIG. 3) elicits acceptable lumber data from a user 90 and/or from a stored set of data 130 that correlates characteristics of lumber with certain actions to be taken by the system, based on the end product to be built using the pieces of lumber. In some embodiments, system 301, using method 101, elicits and receives, from a human user 90 using an input/output device 120, selection data that the system uses to selects one or more sets of criteria and corresponding actions from a stored database that has been pre-loaded with a plurality of sets of criteria and corresponding actions that have been predetermined to meet requirements for each of a plurality of possible end products to be built using the pieces of lumber. In some embodiments, the present invention utilizes one or more of the user devices 120 of each user 90, such as a desktop personal computer 121, laptop computer 122, tablet computer 123, smartphone 124, a position-sensing device 125 (which in some embodiments, is a stand-alone Global Positioning System (GPS) device (such as made by Garmin Ltd.) or in other embodiments, is part of a position-tracking system or another device such as a smartphone 124 or the like), and/or other devices such as wearable computers in clothing or smartwatches 127 or the like. In some embodiments, the human user 90 responds to the eliciting of information by indicating to system 301 which one of a plurality possible end-products is to be manufactured, wherein the criteria and actions for each respective end product is customized and optimized for that respective end product and stored in database 130, such that when an indication is received from the device 120 of user 90, that set of data is then used for the operations of blocks 106 through 112. In some embodiments, at block 106, sensors gather physical data from lumber. In some embodiments, distance data is received from each of one or more sensors for each of a plurality of point locations on one or more pieces of lumber. In some embodiments, those distance data are processed to obtain XYZ coordinates for each of the plurality of point locations, and curve-fitting algorithms are applied to find edges and surfaces of the one or more pieces of lumber, and determine the shapes and curves of edges and surfaces of the lumber. In some embodiments, at block 107, the physical geometric data is compared to the selected set of lumber parameters to obtain data comparison results. In some embodiments, at block 108, the data comparison results have been determined to be acceptable and therefore the piece of lumber is delivered to the processing equipment for the end product being manufactured (such as, for example, an automated saw). In some embodiments, at block 109, the data comparison results have been determined to be unacceptable and un-fixable (at least in regards to this particular station and the uses to which the lumber is to be applied in a commercially reasonable fashion), so control is passed to block 111, and the piece of lumber is delivered to the rejection area. In some embodiments, at block 110, the piece of lumber is determined to be processable if reoriented, so that piece should be reoriented, so as a result the lumber is delivered to a reorienter. In some embodiments, at box 112, the orientation of the lumber is changed by the reorienter and then the now-reoriented piece of lumber is delivered to the processing equipment for the end product being manufactured (such as the automated saw).

Figure 2A:
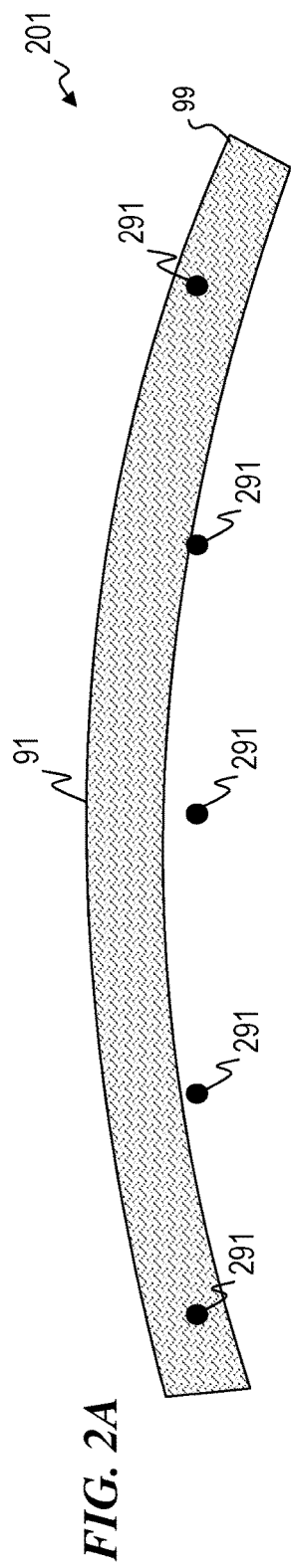
FIG. 2A is a schematic diagram 201 showing exemplary data points used to detect crook in a piece of lumber 99, according to some embodiments of the present invention.

FIG. 2A is a schematic diagram 201 showing a top view of a plurality of exemplary data points 291 gathered along the length of a board and used to detect crook in a piece of lumber 99, and if crook is detected, used to determine the crown face 91 and the amount of curve on the crown face 91, according to some embodiments of the present invention.

Figure 2B:
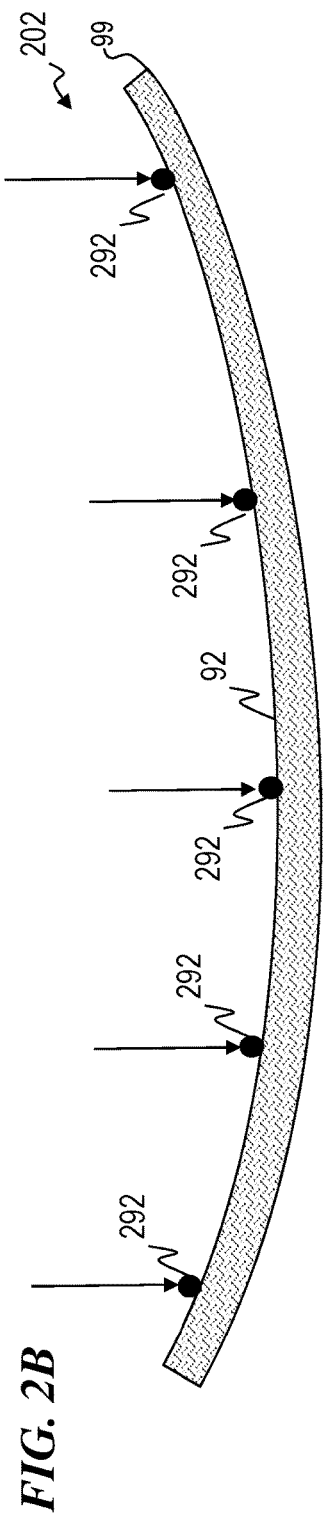
FIG. 2B is a schematic diagram 202 showing exemplary data points used to detect bow in a piece of lumber 99, according to some embodiments of the present invention.

FIG. 2B is a schematic diagram 202 showing a side view of a plurality of exemplary data points 292 gathered along the length of a board and used to detect bow in a piece of lumber 99, and if bow is detected, used to determine the amount and direction of curve on the bowed face 92, according to some embodiments of the present invention.

Figure 2C:
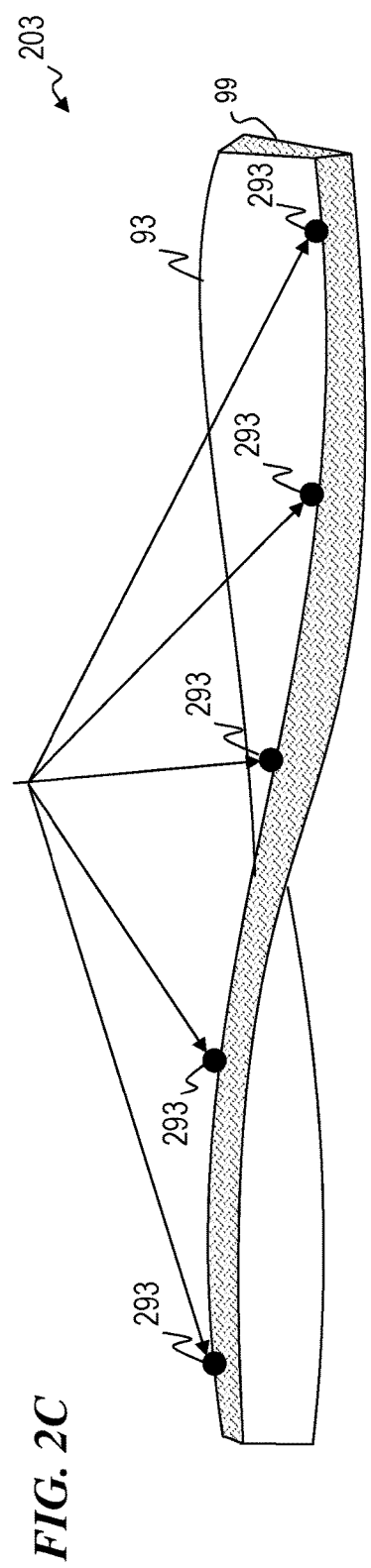
FIG. 2C is a schematic diagram 203 showing exemplary data points used to detect twist in a piece of lumber 99, according to some embodiments of the present invention.

FIG. 2C is a schematic diagram 203 showing a side view of a plurality of exemplary data points 293 gathered along the length of a board and used to detect twist in a piece of lumber 99, and if twist is detected, used to determine the amount and direction of curve on the twisted face 93, according to some embodiments of the present invention.

Figure 2D:
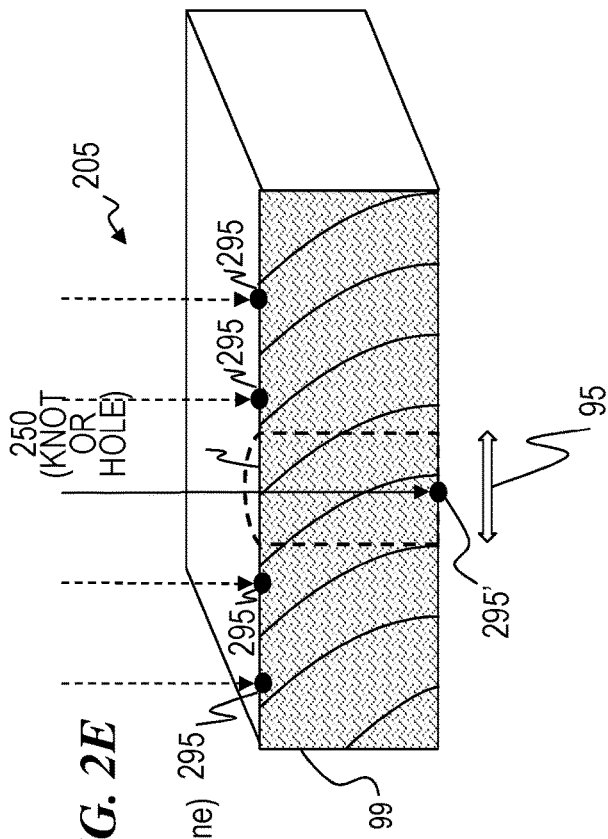
FIG. 2D is a schematic diagram 204 showing exemplary data points used to detect wane 240 and cracks 241 in a piece of lumber 99, according to some embodiments of the present invention.

FIG. 2D is a schematic diagram 204 showing a perspective view of a plurality of exemplary data points 294 gathered across the width of a board and used to detect cracks 241 and wane 240 in a piece of lumber 99, and if cracks and/or wane are detected, used to determine the amount and position of any crack(s) and/or the amount and which corner(s) are missing on the wane surface 94, according to some embodiments of the present invention.

Figure 2E:
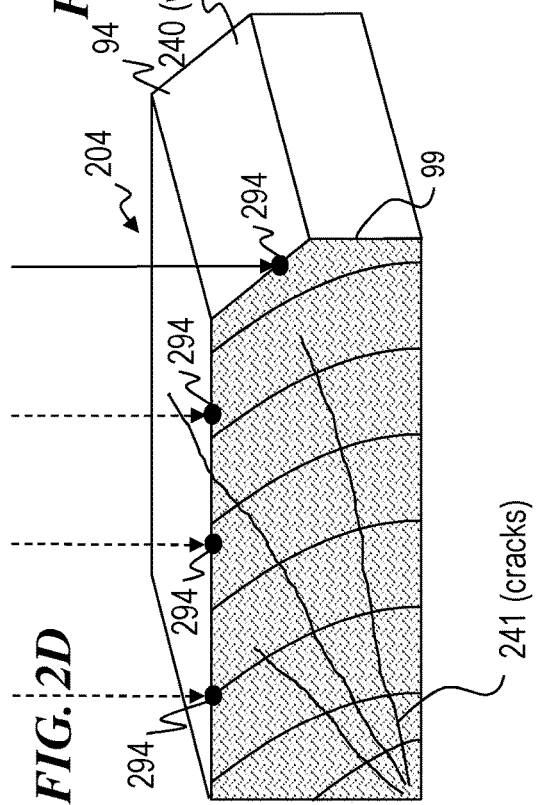
FIG. 2E is a schematic diagram 205 showing exemplary data points used to detect a knot 250 in a piece of lumber 99, according to some embodiments of the present invention.

FIG. 2E is a schematic diagram 205 showing a perspective view of a plurality of exemplary data points 295 gathered across the width of a board and used to detect a knot 250 in a piece of lumber 99, and if one or more knots are detected, used to determine the size and position of any knots and/or the amount (size) and positions of the missing wood at the knot position 95, according to some embodiments of the present invention. In some embodiments, one or more of the data points (e.g., point 295') indicates a data point in the middle of a board that is well below the other data points 295 on the top surface.

Figure 2F:
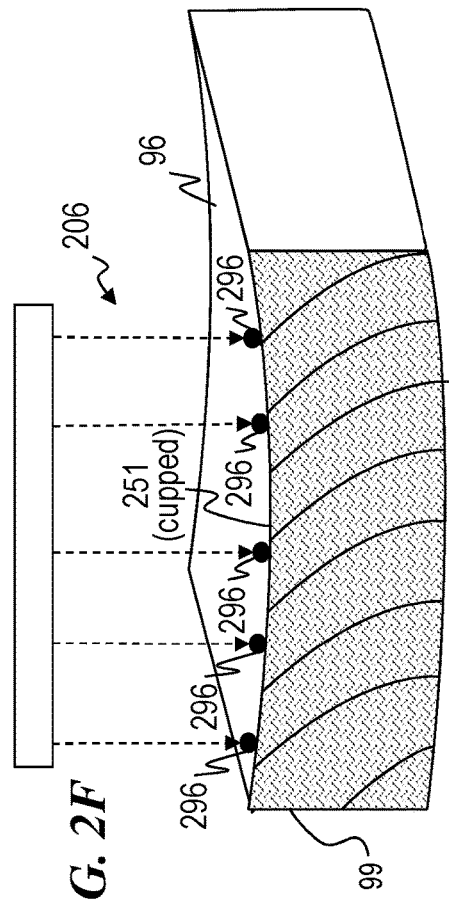
FIG. 2F is a schematic diagram 206 showing exemplary data points used to detect cupping 251 in a piece of lumber 99, according to some embodiments of the present invention.

FIG. 2F is a schematic diagram 206 showing a perspective view of a plurality of exemplary data points 296 gathered across the width of a board and used to detect cupping 251 in a piece of lumber 99, and if cupping is detected, used to determine the amount and direction of curve/cupping on the cupped face 96, according to some embodiments of the present invention.

Figure 3B:
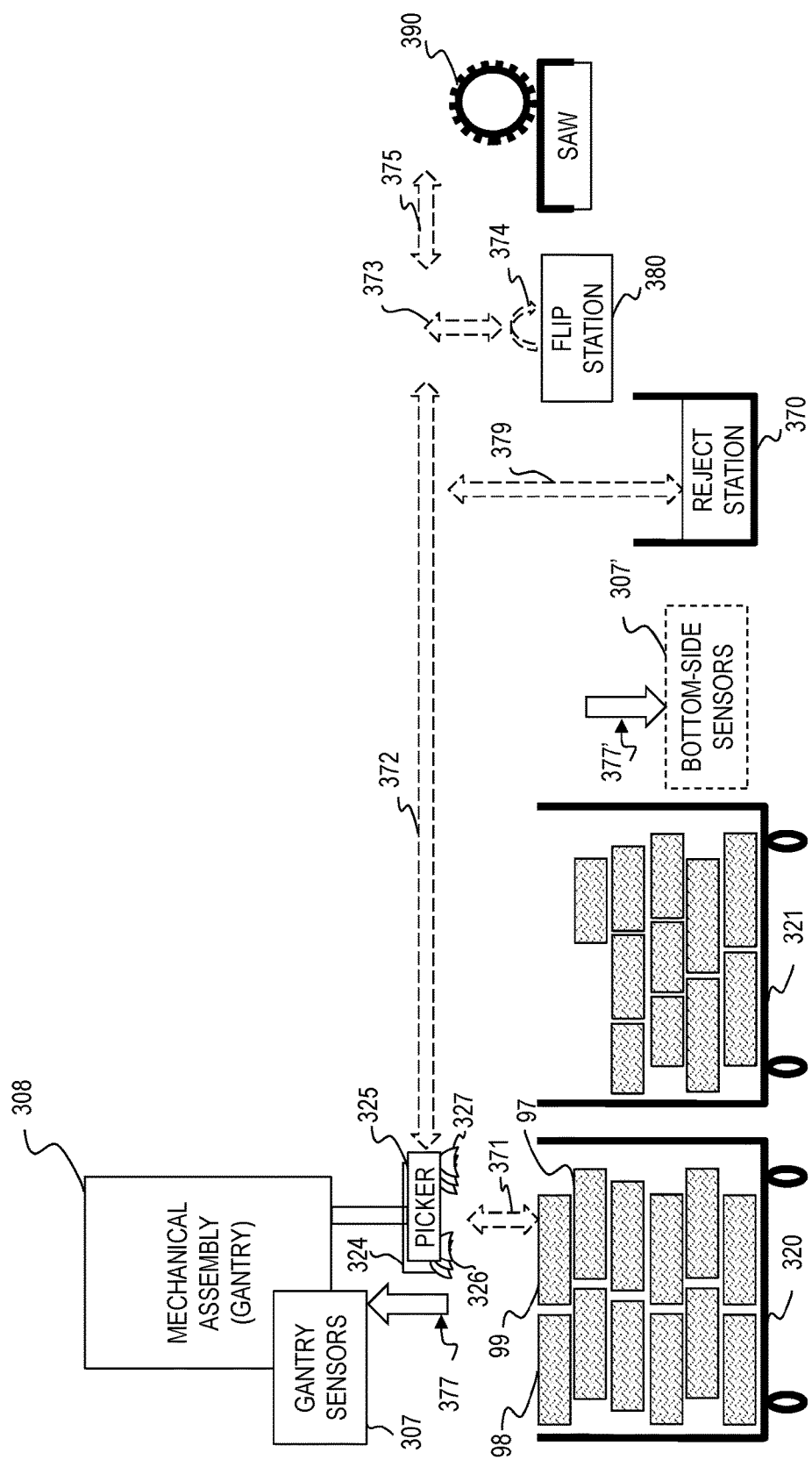
FIG. 3B is an end-view schematic diagram of lumber-analyzer system 301, according to some embodiments of the present invention.

FIG. 3A is a side-view schematic diagram of a lumber-analyzer system 301, according to some embodiments of the present invention. In some embodiments, system 301 includes a computer processor 305 (in some embodiments, a Raspberry Pi® is used for processor 305 and is located on gantry 308, and uses open-source software (e.g., OPENCV) that has box, line, and color detection as well as knot and crack detection, where sometimes wane shows better in in images from a visual sensor due to the color of bark), wherein computer processor 305 includes a plurality of input/output data devices 306 and a plurality of gantry sensors 307 that obtain image and/or distance data 377 from the top of lumber 99 on cart 320, and/or bottom-side sensors 307' that obtain image and/or distance data 377' from the bottom of a piece of lumber 99 that has been removed from a cart 320 (e.g., in some embodiments, one of a plurality of such carts 320-321) as the piece of lumber is being moved toward the rejection station 370, the flip station 380 and/or the saw station 390 (see FIG. 3B). In some embodiments, system 301 further includes a mechanical assembly 308 integrated with computer processor 305 to grab (using picker assembly 325) and reposition a piece of wood lumber 99 based on software code executing in computer processor 305 that processes the point location data received from gantry sensors 307 and/or bottom-side sensors 307'. In some embodiments, a database 130 (containing criteria-and-action data for each one of a plurality of end products to be made from the lumber) is operatively coupled to computer processor 305. In some embodiments, a non-transitory computer-readable medium 310 (storing thereon instructions for performing the method of the present invention) is connectable to computer processor 305, for example, via one or more of the plurality of input/output data devices 306.

FIG. 3B is an end-view schematic diagram of lumber-analyzer system 301, according to some embodiments of the present invention, which, for convenience, illustrates the processing of lumber where the lumber is moved left-to-right in the figure. In some embodiments, only top-side gantry-located sensors 307 are used, while in other embodiments, only bottom-side sensors 307' are used, while in yet other embodiments, both top-side gantry sensors 307 and bottom-side sensors 307' are used. In some embodiments, the mechanical assembly (e.g., the gantry) 308 has (in addition to the gantry sensors 307 if used) a single board-picker mechanism 325 that is used and carries one board at a time (from left-to-right in the FIG. 3B), while in other embodiments, gantry 308 has (in addition to the gantry sensors 307 if used) a plurality of board-picker mechanisms 324-325 that are each used to carry one or more boards at a time (from left-to-right in the FIG. 3B). In some embodiments, gantry 308 is operable to pick one or more boards from each of one or more of a plurality of carts 320-321 (only two of which are shown here).

Continuing to refer to FIG. 3B, in some embodiments that use only top-side gantry-located sensors 307, a board 99 is scanned or imaged by gantry sensors 307 to determine the position and orientation of board 99 in absolute terms and/or in relation to other boards 97 and 98. In some embodiments, the points along the edges and top surface of board 99 are determined and distinguished by the height difference relative to the points detected of a lower board 97. In some embodiments, the points along the edges and top surface of board 99 are determined and distinguished by the brightness differences of the boards relative to the spaces between top board 99 and top board 98. In some embodiments, the points along the edges and top surface of board 99 obtained from top-side gantry-located sensors 307 are used to position picker(s) 324 and/or 325 in order to pick up board 99 (and/or simultaneously pick up board 98). Based on the geometry data obtained from the top-side gantry-located sensors 307, the board 99 is picked up by path 371, carried along path 372, possibly dropped along path 379 to rejection station 370 (in the case where system 301 and method 101 have determined that the current processing stations are not able to accommodate the detected flaws in the board), or deposited on flip station 380 by path 373 and/or taken to saw station 390 by path 375. In some embodiments, if the board is deposited on flip station 380, it is flipped over along path 374 (rotated 180 degrees around its long axis) and then the opposite side is inspected by gantry sensors 307 (or the board is picked up by picker(s) 324-325 and transported back over the bottom-side sensors 307' to perform the detailed inspection of the side not originally inspected during the first pass over sensors 307'), and based on the inspection of the opposite side, the now doubly-inspected board is dumped at reject station 370 or transported and placed on saw station 390.

In some embodiments, system 301 uses its detection of the crown face (which typically has only one "high" point) of a crooked board to place the side opposite the crown face (which typically has two "high" points) against the saw fence of saw station 390 so the board is more stable and does not move as the board is being sawed. Flip station 380 facilitates this positioning.

In some embodiments, system 301 uses method 101 to elicit and receive optical and/or XYZ point locations data (geometry data regarding the surfaces and edges of the lumber) to detect and measure wane or cracks on the board (see FIG. 2D). In some embodiments, system 301 detects cup defects (see FIG. 2F). In some embodiments, the system 301 detects crook defects (see FIG. 2A) and determines the crown face of the board. In some embodiments, system 301 further performs wane detection and/or split detection (see FIG. 2D), knot detection (see FIG. 2E), and/or bark detection (see FIG. 2D).

In some embodiments, system 301 detects other data (non-geometry data) such as grain quality and ring density. In some embodiments, these parameters are determined by one or more video cameras and one or more machine-vision algorithms applied to images obtained from the camera(s).

In some embodiments, system 301 reorients the lumber by physically flipping the lumber piece around its longest axes and/or rotating the lumber piece on one of its short axes to better optimize wood via mechanical action. In some embodiments, reorientation of the lumber is accomplished using compressed air; for example, by placing the piece of lumber on a surface (of flip station 380) having a plurality of holes through which compressed air is selectively applied in a short burst along one edge to flip the board around its longest axis. In some other embodiments, reorientation of the lumber uses mechanical clamps or fasteners, such as a clamping device that grabs opposite faces of the piece of lumber, or a piercing device that screws or pierces to grab the lumber and flip the board around its longest axis.

FIG. 4A is a perspective view of a lumber-analyzer and processing system 401, according to some embodiments of the present invention. In some embodiments, system 401 includes a plurality of lumber-carrying carts 320-321 (ten such carts are shown here), and gantry 308 conveys one or more pieces of lumber 98-99 from one of the carts 320-321 eventually to saw station 390 in the upper left of the diagram of FIG. 4A. In some embodiments, gantry 308 travels along track 411 that is supported by a plurality of cantilevered arms 410, and which runs at right-angles to track 411. In some embodiments, bottom-side sensors 307', as well as stations 370 and 380 of FIG. 3B (not shown here for simplicity) are located between end cart 321 and saw station 390. In other embodiments, bottom-side sensors 307', and stations 370 and 380 of FIG. 3B are located at other suitable positions. In some embodiments, another conveyor system using track 491 and gantry 498 picks up and moves the sawn lumber pieces from saw station 390 to a truss-assembly station 490 (for example, such as described in U.S. Provisional Patent Application 62/144,859 by Steven Weinschenk, and U.S. patent application Ser. No. 15/093,732 filed Apr. 7, 2016 by Steven R. Weinschenk et al., titled "DIGITAL PROJECTION SYSTEM AND METHOD FOR WORKPIECE ASSEMBLY"; and/or the other patents and patent publications described in the background section above, which are incorporated herein by reference in their entirety).

In some embodiments, one or more human users 90 communicate with system 301 or 401 via wireless communications such as one or more of the devices 110 of FIG. 1. In some such embodiments, human users 90 communicate with system 301 or 401 via wireless mobile devices 123, 124, 125 and/or 127.

Figure 4B:
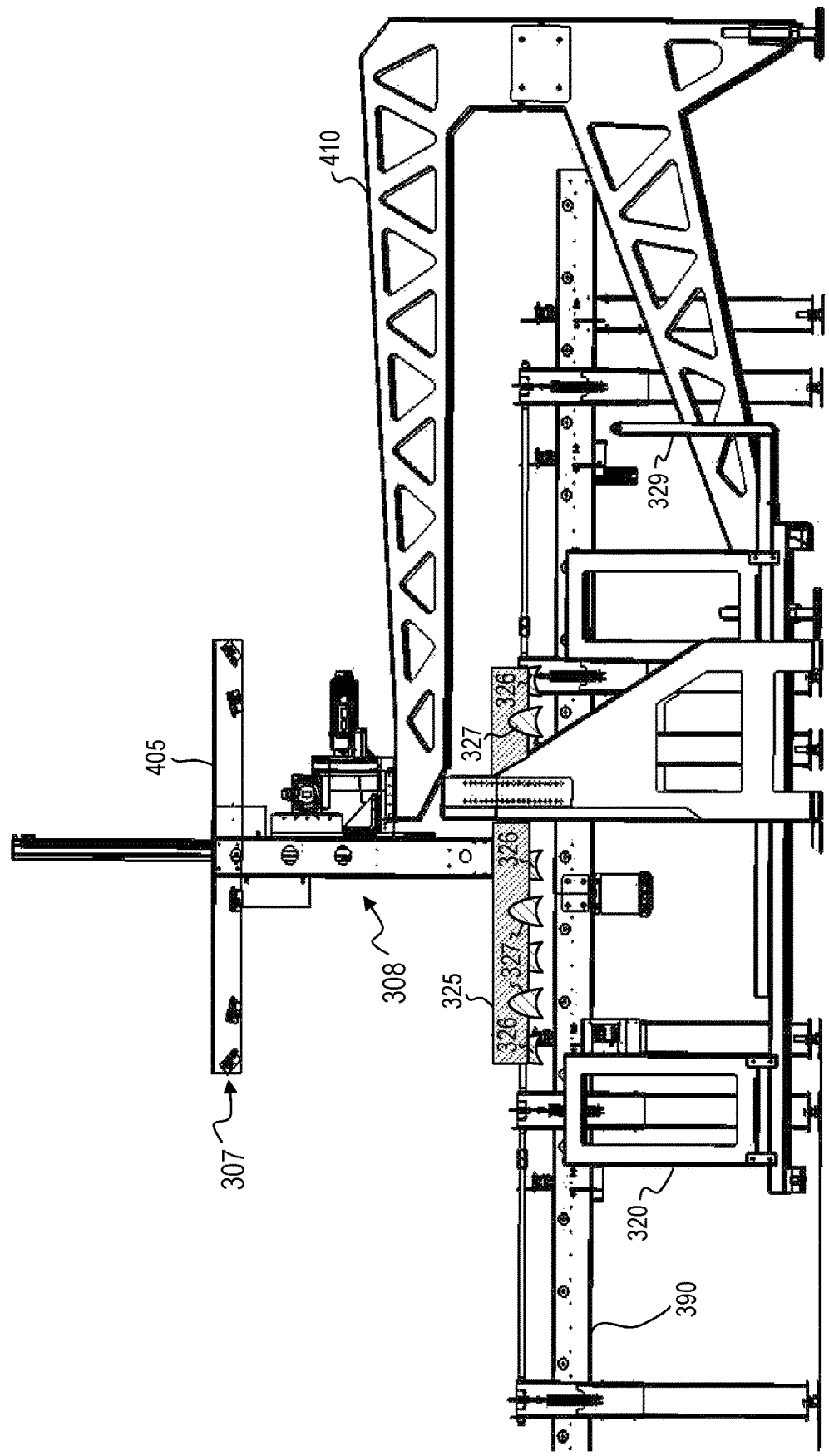
FIG. 4B is a side-view of lumber-analyzer system 401, according to some embodiments of the present invention.

FIG. 4B is a side-view of system 401, according to some embodiments of the present invention. The various parts and features are as described above for like reference numbers. In some embodiments, the gantry sensors 307 are mounted on sensor arm 405. In some embodiments, the cart handles 329 are located on the opposite end of cart 320 as shown in FIGS. 4A and 4B, such that human workers can pull empty carts out towards the left and replace the removed empty carts with carts full of lumber pieces by pushing the replacement carts into position in a left-to-right direction relative to this figure.

Figure 4C:
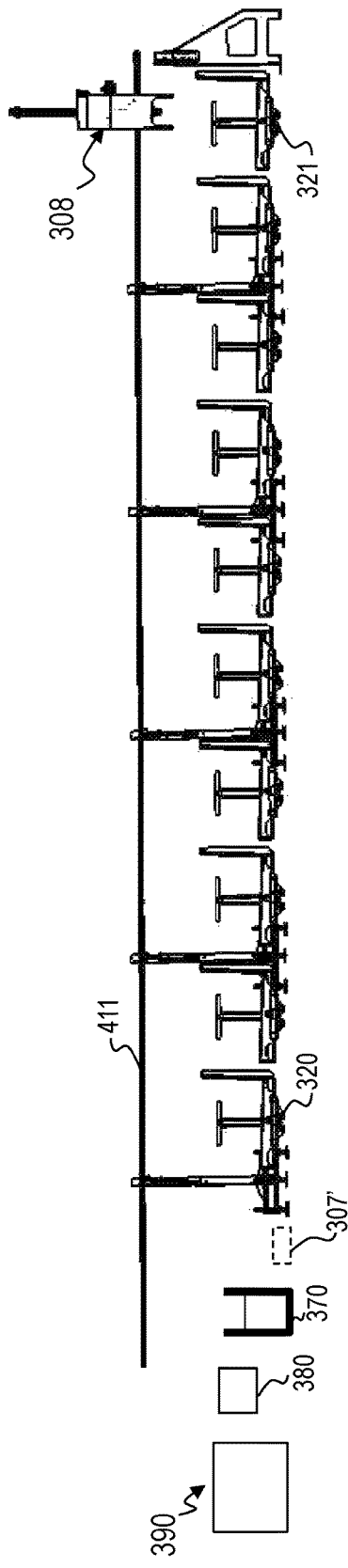
FIG. 4C is a front-end view of lumber-analyzer system 401, according to some embodiments of the present invention.

FIG. 4C is a front-end view of system 401, according to some embodiments of the present invention. The various parts and features are as described above for like reference numbers.

Figure 4D:
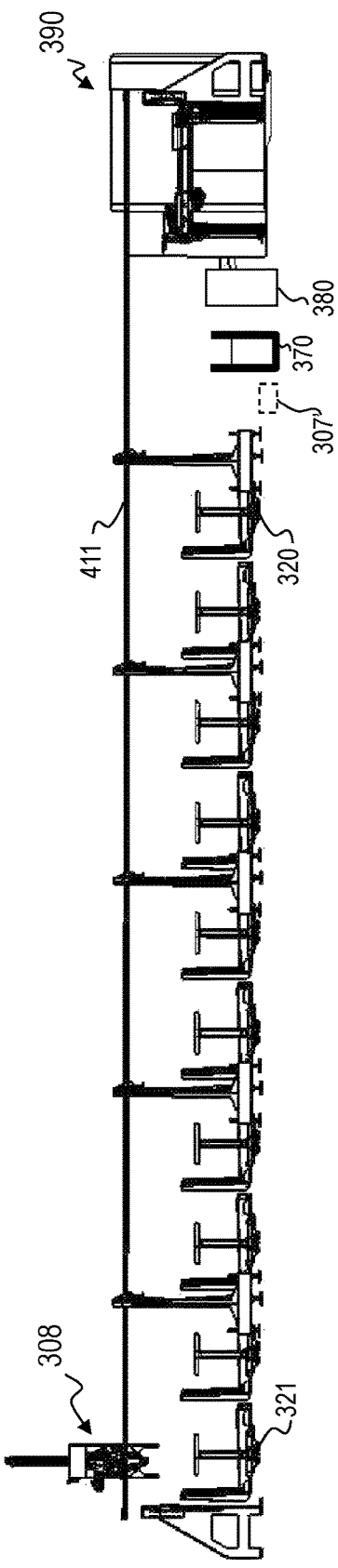
FIG. 4D is a back-end view of lumber-analyzer system 401, according to some embodiments of the present invention.

FIG. 4D is a back-end view of system 401, according to some embodiments of the present invention. Again, the various parts and features are as described above for like reference numbers.

Figure 4E:
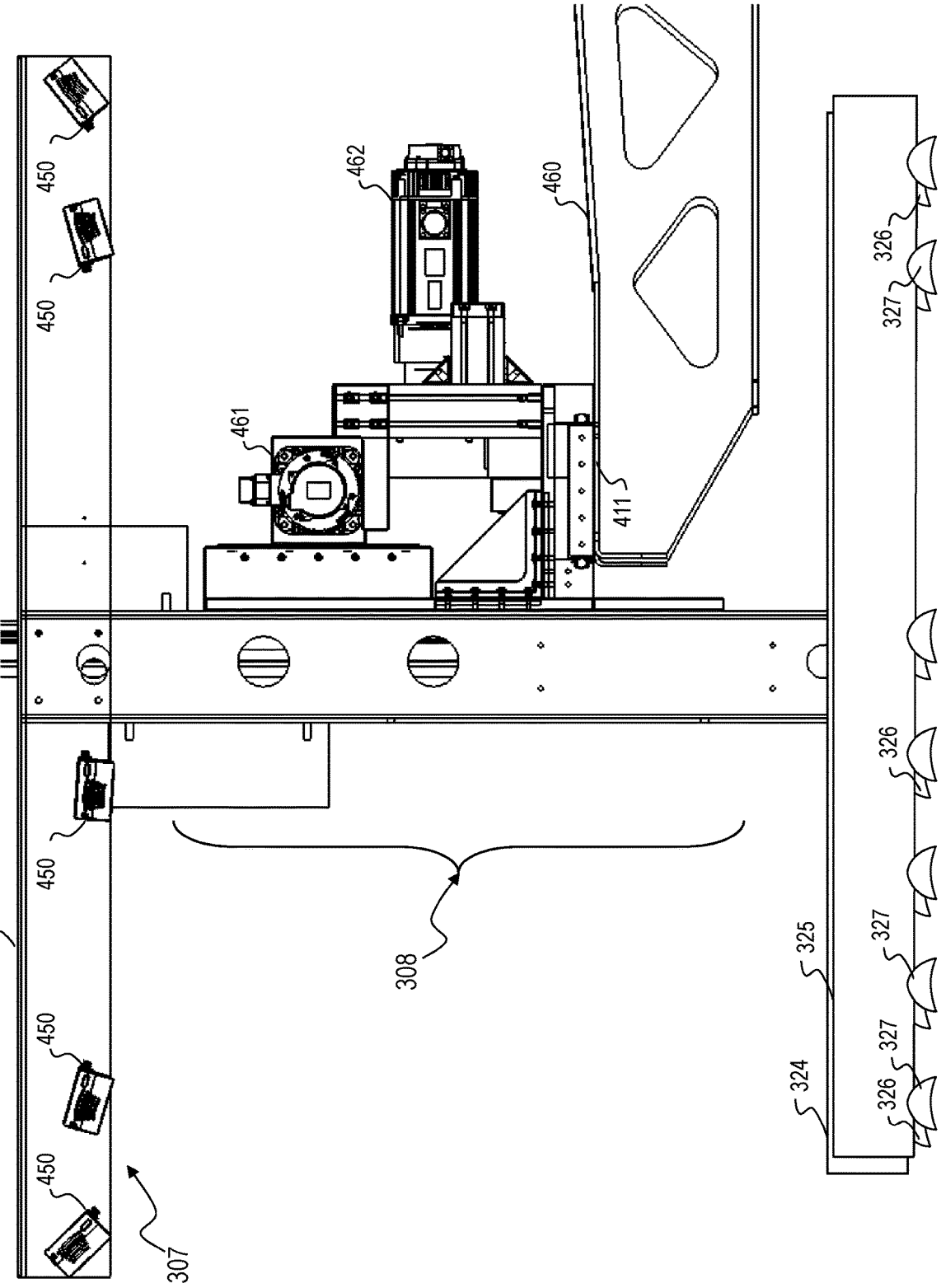
FIG. 4E is a close-up side-view schematic diagram of a lumber-analyzer system 401, according to some embodiments of the present invention.

FIG. 4E is a close-up side-view schematic diagram of a portion of system 401, according to some embodiments of the present invention. In some embodiments, system 401 uses gantry sensors 307 that include a plurality of distance sensors 450 mounted to arm 405 at a plurality of spaced-apart locations and angled orientations situated to sense both ends and a plurality of intermediate positions of boards up to about 20 feet (about 6 meters) long. In some embodiments, five point sensors are used, and the system is calibrated to convert the distance parameter from each sensor (which is at a given angle and sensor height, and a known Z-position of the gantry 308 along track 411) to the X, Y, and Z coordinates of each point measured. In other embodiments, a 3D sensor (e.g., the O3D302 sensor from IFM Efector, Inc., 1100 Atwater Drive, Malvern, Pa. 19355) measures XYZ coordinates of a plurality of locations substantially simultaneously (e.g., up to 64 or more points at each time a measurement is taken (e.g., in some embodiments, up to four or more timed per second)). In some embodiments, track 411 is mounted on arm 460, and motor 461 moves one or more pickers 324-325 up and down, while motor 462 is used to move gantry 308 and sensors 307 together along track 411 (in a direction that would be towards or away from the surface of FIG. 4E). In some embodiments, picker 324 includes a plurality of suction (vacuum) operated attachment units 326, and picker 325 includes a plurality of suction (vacuum) operated attachment units 327. In other embodiments, other picker modalities are used (such as piercing points or screws that penetrate the piece of lumber, or clamping jaws that grab and hold the lumber).

Figure 5A:
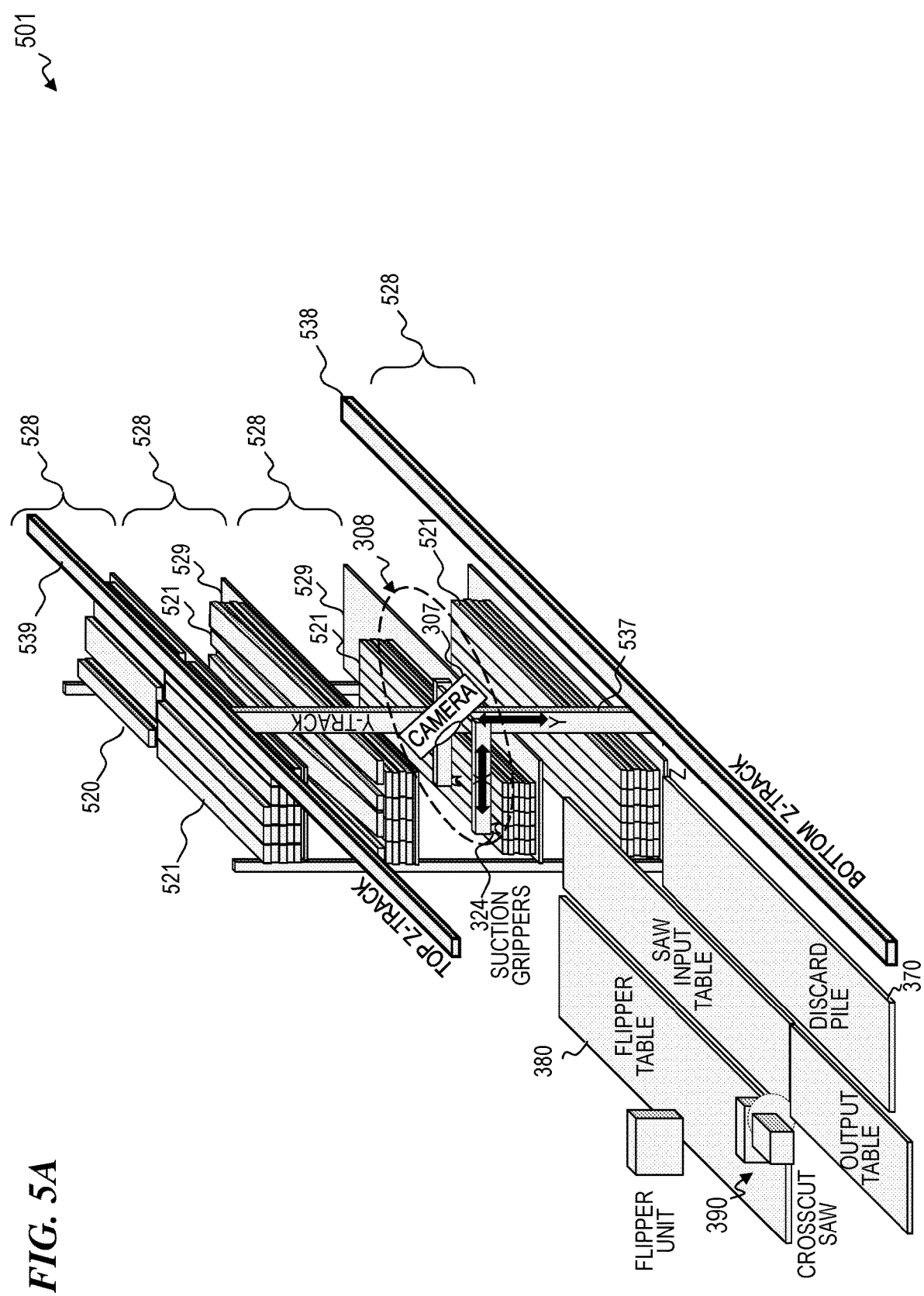
FIG. 5A is a schematic diagram of a lumber-analyzer system 501, according to some embodiments of the present invention.

FIG. 5A is a schematic diagram of a lumber-analyzer and processing system 501, according to some embodiments of the present invention. In some embodiments, system 501 includes a gantry 308 that moves in and out relative to a plurality of stacks of lumber, each located on one of a plurality of bunks 528 (in the embodiment shown here, each bunk uses a shelf 529 to support its stack of lumber; in other embodiments, a plurality of cantilevered arms extending perpendicular to the long axes of the boards are spaced apart along the length of the boards and facilitate loading the bunks using a forklift or similar machinery) that are vertically displaced relative to one another, in contrast to stacks of lumber that are horizontally displaced relative to one another as shown in FIGS. 4A-4E. In some such embodiments, the picker 324 moves left-and-right relative to the figure to reach in above a selected one of the plurality of stacks of lumber 520-521, where one or more stacks of lumber 520-521 are placed on a plurality of vertically displaced shelves 529. A Y-track 537 is used to move the gantry 308 vertically to a selected one of the plurality of shelves 529 and its stack(s) of lumber 520-521, where a picker 324 (e.g., in some embodiments, using suction grippers) picks up a board that has been measured (as described above, for crook, bow, twist, cup, cracks and/or knots and the like), and delivered to flipper 380 and/or saw 390, or to the reject station 370. Thus, in some embodiments, gantry 308 moves up-down to one of plurality of stacked bunks (using shelves 529 or other suitable supports) of lumber stacks 320-321. Gantry 308 moves left-right over selected stack (e.g., 321) of lumber, picks a selected board 99, and camera/scanner 307 measures crown, bow, twist, wane, color, grade. Gantry 308 moves back-forth using tracks 538 and 539 between the stacked bunks 528 and saw input table of saw unit 390 (or flipper 280 or the discard pile of the reject unit 370).

Figure 5B:
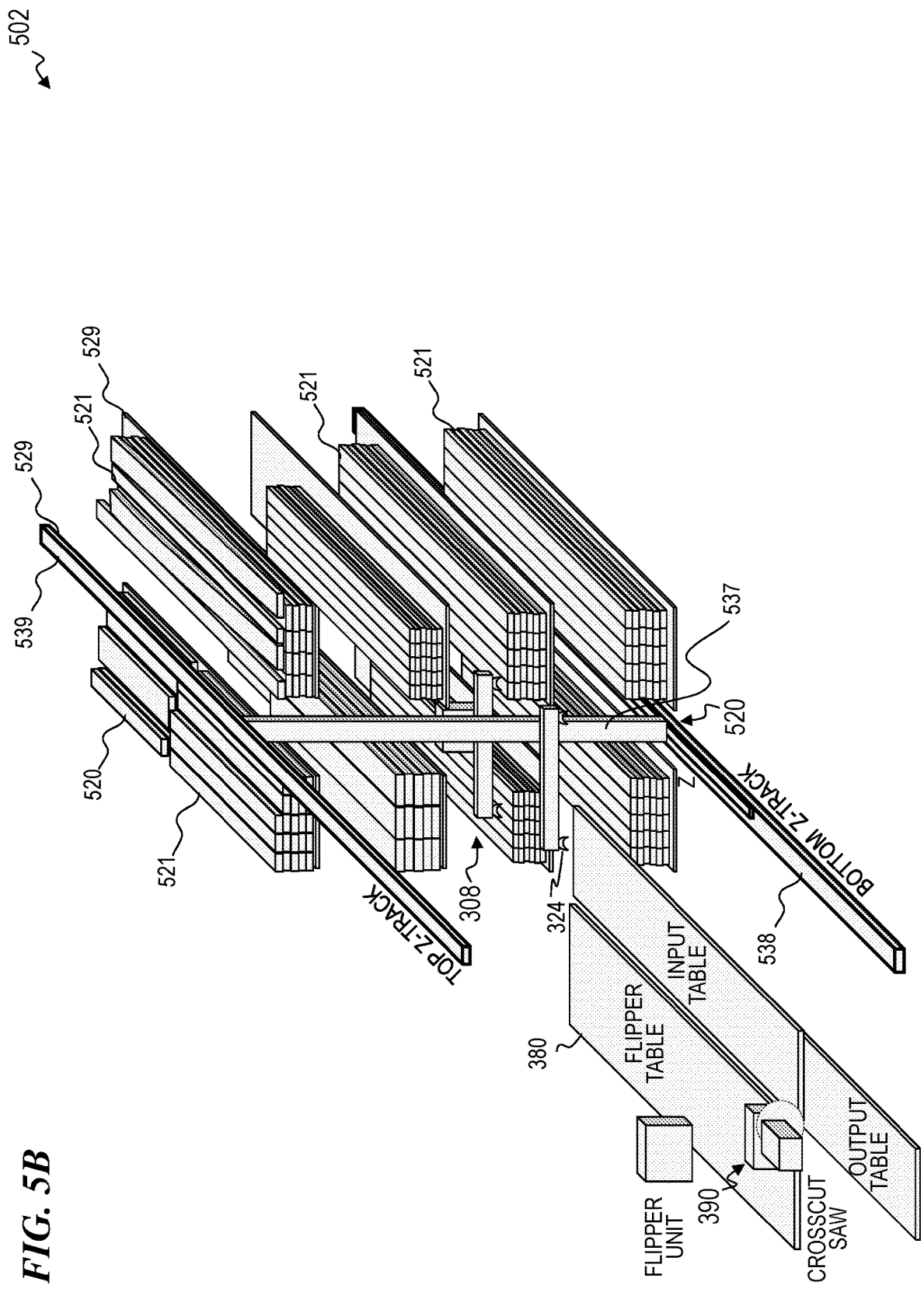
FIG. 5B is a schematic diagram of a lumber-analyzer system 502, according to some embodiments of the present invention.

FIG. 5B is a schematic diagram of a lumber-analyzer system 502, according to some embodiments of the present invention. In some embodiments, system 502 is similar to system 501 described above, but has sets of bunks of lumber that are vertically positioned on both of the two sides of a centrally positioned gantry-movement system. Thus, in some embodiments, gantry 308 moves up-down to one of plurality of stacked bunks (using shelves 529 or other suitable supports) of lumber stacks 320-321. Gantry 308 moves left-right over selected stack (e.g., 321) of lumber, on the LEFT SIDE OR RIGHT SIDE of the central gantry-movement system 520, and picks a selected board 99, and camera/scanner 307 measures crown, bow, twist, wane, color, grade. Gantry 302 moves back-forth using tracks 538 and 539 between the two sets of stacked bunks and saw input table of saw unit 390 (or flipper 280 or the discard pile of the reject unit 370).

Figure 6:
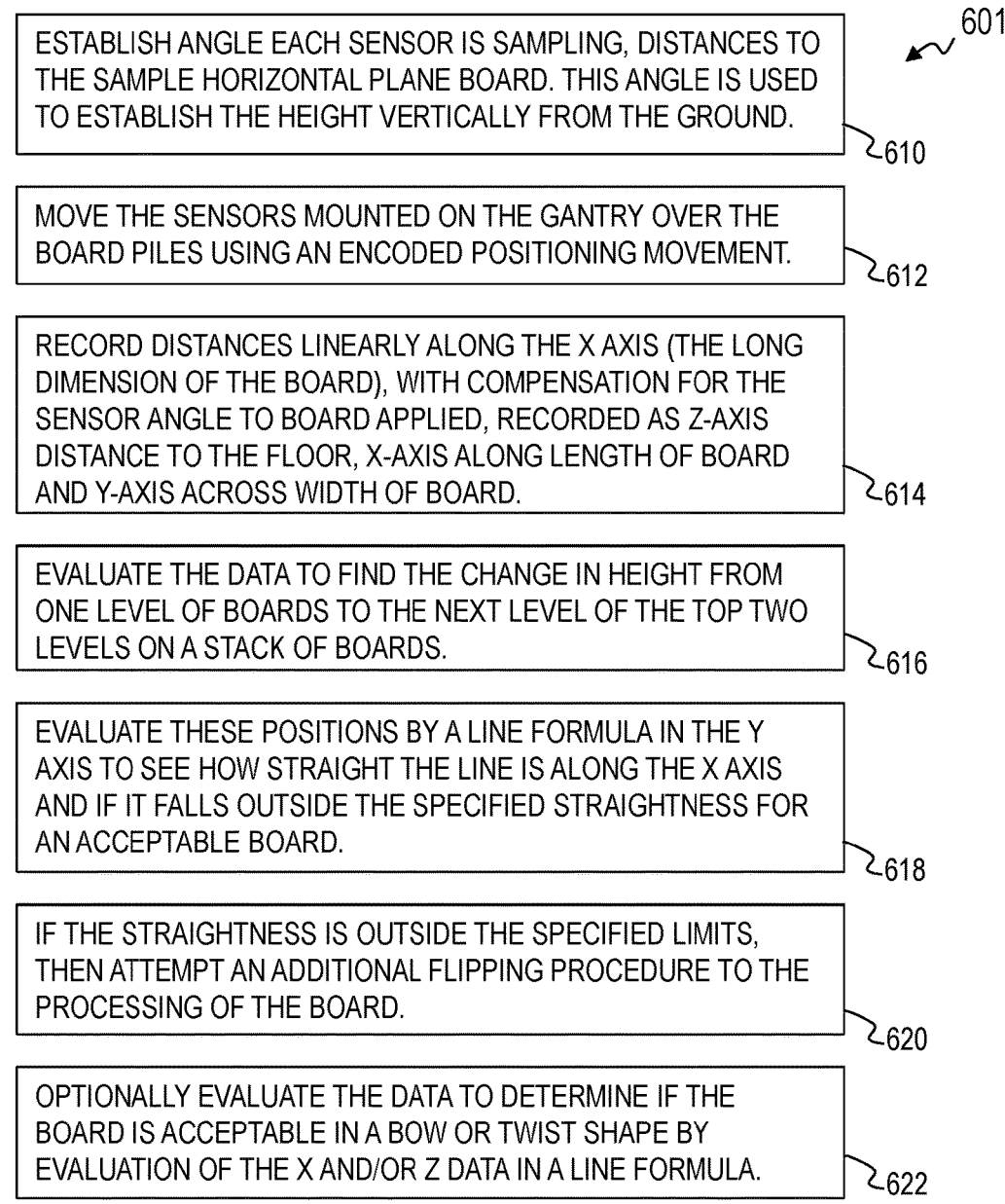
FIG. 6 is a flowchart of a method 601, according to some embodiments of the present invention.

FIG. 6 is a flowchart of a method 601, according to some embodiments of the present invention. In some embodiments, method 601 includes block 610 that establishes the angle each sensor is sampling and the distances to the sample horizontal plane board (this angle is used to establish the height vertically from the ground); block 612 that moves the sensors mounted on the gantry over the board piles using an encoded positioning movement; block 614 that records distances linearly along the x axis (the long dimension of the board), with compensation for the sensor angle to board applied (to change from a linear distance at angle to XYZ coordinates of each point measured), recorded as Z axis distance to the floor, X axis along length of board and Y axis across width of board; block 616 that evaluates the data to find the change in height from one level of boards to the next level of the top two levels on a stack of boards (in order to distinguish where the edge of the board is—the transition from one plane to the next indicates the edge of the board at five or more locations, which determines whether the board is straight or curved); block 618 that evaluates these positions using a line formula in the Y axis to see how straight is the line along the X axis and if it falls outside the specified straightness for an acceptable board; block 620 that, if the straightness is outside the specified limits, then attempts an additional flipping procedure to the processing of the board (to ensure that the proper edge (e.g., the outside or crown edge) is on the desired side of the board); and block 622 that optionally evaluates the data to determine if the board is acceptable in a bow or twist shape by evaluation of the x and/or z data in a line formula. In some embodiments, the present invention provides a vacuum picker, a screw picker, a hook picker, a clamp picker, a piercing picker, or a picker that incorporates a plurality of such modalities. In some embodiments, a dual picker includes two sets of vacuum pick heads, each set able to pick a separate board. In some embodiments, if twist or cupping is detected, the system may reject board. In some embodiments, wane boards are lower grade and the system can pick through the boards and sort relative to criteria that indicates "OK for some uses." In some embodiments, the sensors 307 are all on the top-of gantry. In some embodiments, another set of sensors 307' is looking up to detect wane, bow, etc. from underneath. In some embodiments, sensors 307' are an alternative to top-side sensors 307 or in other embodiments, they are an additional set of sensors. When used, sensors 307' scan the underneath side of boards on the picker 325. In some embodiments, the boards are put on flipping station 380 before re-grabbing to put onto saw station 390.

In some embodiments, the home position for each of the plurality of carts 320-321 includes a centering track and an end stop that facilitates locating of the cart so the system 301 can more easily locate the cart and its stack of lumber.

In some embodiments, the present invention provides a method and system that performs one or more of the following procedures:
  scans or images a pile of lumber;
  determines whether one or more boards is acceptable as is or if it/they need reorientation;
  orient the board such that the crown of this board matches (is oriented in the same direction as the crown of another board in the truss or wall section being assembled) or complements (is oriented to compensate for the crown of another board that is oriented in a different direction) another board;
  detects the dimension (whether 2×4, 2×6, 2×8, or other dimension) of a selected board (which is particularly useful if boards if different dimensions are mixed in a pile held by a cart or bunk, or when several piles are available and someone changes carts or the operator does not want to enter the data by hand for each cart), wherein in some embodiments, the system detects indents between boards in an image and measures the width of each board;
  measures how high a stack of 2×4's is and uses the height and width to determine how many pieces of lumber is in the pile; and/or
  determines whether there are enough pieces for this job.
For example, in some embodiments, if there are ten carts in a row (each cart holding a plurality of pieces of lumber), the machine goes to a cart and re-scans the cart (in case a person has moved the cart, or added or removed boards, or some other change has occurred), picks up a board and delivers the board to the saw machine or to the flipper machine.

In some embodiments, the measurement and determination of the geometry (curves, bow, crown direction and the like) is performed while the board is on a cart 320 or bunk 528, and/or held by a picker on the gantry 308, and/or on the flipper station 380.

In some embodiments, the sensors include multiple single-point distance sensors (e.g., analog distance sensors such as a model VDM28-8-L-IO/110/115b/122 distance sensor available from Pepperl and Fuchs; www.pepperl-fuchs.com), which provide outputs wherein a perfectly straight board trips all the sensors at the same time. Sometimes, if a board is diagonal (for example, as a result of a person hand throwing lumber in pile), then the vacuum pickups cannot pick up the board. As sensors go over the board, the sensors trip in sequence (at different times) so board is determined to be straight but skewed on the pile. In other embodiments, instead of analog sensors, the system 301 or 401 uses a video camera and filters the image data to find the data needed (for example, the color of the lumber can tell whether each board is treated (e.g., with anti-rot chemicals) or not treated) and tells length (in some embodiments, the method and system use OPENCV open-source software to analyze the images). In some embodiments, the user will retrofit the machine by adding a camera, then archive (store into an image database) the images of each board that go in, so that when a particular board goes into a truss as the truss is being manufactured, the forensic investigator can tell when that board got cracked (before, during or after assembly). Some embodiments further include one or more Kinect®-type 3D sensor-and-camera subsystems. Such scanners may cost only about $2000, and the scanner can get a 3D profile to measure how much wane is missing on a board (for example, if the wane is only on three feet of a 20 foot-board, the system can cut pieces to maximize the value obtained from pieces of that board, thus obtaining much greater value than the cost of the 3D sensor).

In some embodiments, the system 301 or 401 includes an image projector that projects an image onto the work surface of saw machine 390 (similar to projection systems such as described in co-pending U.S. patent application Ser. No. 15/093,732 filed Apr. 7, 2016 by Steven R. Weinschenk et al., titled "DIGITAL PROJECTION SYSTEM AND METHOD FOR WORKPIECE ASSEMBLY"; which is incorporated herein by reference in its entirety), then notifies the human operator to reposition a board on the saw machine work surface according to the projected image. This is particularly useful for unusual situations where the system has difficulty correcting for a particular defect in a board (by moving the board on the saw so it can be properly cut).

In some embodiments, system 301 or 401 uses one of the sensors 307 to scan reloaded carts for barcodes on the lumber or other indicia such as a barcode on wrapping paper. The scanned barcode information goes into gantry system and is communicated to the system processor. In some embodiments, a smartphone scan by the operator is wirelessly communicated into gantry system to collect barcode from carts and barcodes from lumber wrapper, and correlate the barcode from the wrapper to the barcoded cart holding lumber previously in that wrapper. In some embodiments, for a grade stamp that is only on a board, or alternatively on the wrapper, in text, the system 301 or 401 reads those characters and performs OCR (optical character recognition) to get grade of every board. In some embodiments, system 301 or 401 flips a piece of lumber to get an image of the grade stamp on that board.

In some embodiments, system 301 determines the length of each board, which is needed because operators sometimes throw boards on pile by mistake.

In some embodiments, system 301 or 401 includes a projector system (such as SteadyShot™, or such as described in co-pending U.S. patent application Ser. No. 15/093,732 filed Apr. 7, 2016 by Steven R. Weinschenk et al., titled "DIGITAL PROJECTION SYSTEM AND METHOD FOR WORKPIECE ASSEMBLY" which is incorporated herein by reference in its entirety) that is originally used for roof trusses, but in the present system is now also used for wall panels, studs, windows, cripple studs and the like. In some embodiments, the system then takes a picture of wall before putting sheeting on it when building a wall section. Conventional systems and methods using a power nailer assumed studs were straight (not bowed) so nails would miss the bowed studs. To remedy this, some embodiments of the present system take a digital image of the assembled stud product before sheathing is applied, and then use a projector system to project, onto the sheathing, the image of the studs taken before the sheathing is placed over the studs (so the human operator of the nailing gun can see exactly where the underlying studs are when nailing) and/or the predetermined nailing pattern for a particular wall panel, as automatically modified by pattern-recognition software based on the image of the studs taken before the sheathing is placed over the studs, where the projected image of the studs shows bowed studs that are hidden behind sheeting, providing a way for the user to nail into the bowed studs.

In conventional systems, the stacks are limited-whole job must be same grade. In contrast, system 301, 401 or 501 can pick and choose boards from a pile containing different lengths and grades of lumber and select boards that are best suited and modifiable to optimize the product being built.

In system 301 or 401, the gantry 308 deals with horizontal boards that are piles on side-by-side carts 320-321. The horizontal spacing of the carts 320 takes lots of floor space. A factory often needs to pull stuff out to put in a system 301. In contrast, the new vertical picker of system 501 allows the picker and gantry to pick off boards from stacks that are on top of one another on bunks (shelves or other types of lumber holders).

In some embodiments, the saw stations 390 (of system 301, 401 or 501) cut pieces from 16-foot, 18-foot, and 20-foot boards-often the product needs a 6-foot board, and that leaves a 10-foot piece, which the system picks up and puts back on one of the "incoming" piles of lumber on a cart 320 or bunk 528.

In some embodiments, system 501 (sometimes called a vertical air pick wood runner) has a new gantry 528 that moves horizontally in a direction parallel to the long axis of boards on single shelf that has 10-foot and 6-foot pieces end-to-end on the same cart 320-321 or bunk 528.

In some embodiments, system 301, 401 or 501 includes a "light-curtain" scanner to stop the machinery if people move into the way (providing a volume of space within which the machinery can move without harming a person). In some embodiments, the gantry moves up and out of way so a forklift gains access to load wood onto a bunk 528.

In some embodiments, the present invention includes a 24-foot long "rip" saw operatively coupled to the infeed of a cross-cur saw station 390, wherein the rip saw slices a board end-to-end parallel to its long axis (e.g., to cut a 2×8 board into a 2×6 board and a 2×2 board).

In some embodiments, system 502 has a gantry 308 that picks boards from bunks on either side of the lengthwise path of the gantry motion system.

In systems that have ten bunks on carts that are horizontally spaced, it takes lots of floor space. In some embodiments, system 502 includes a plurality of sets of bunks, wherein each set of eight bunks has its own gantry (e.g., a four-high double-sided organization). In some embodiments, system 501 or 502 includes a further set of bunks spaced lengthwise at a distance further from the saw station 390 as the set shown in FIG. 5A or FIG. 5B. In some embodiments, system 501 or 502 includes a further set of bunks spaced lengthwise on the opposite end of the saw station 390 as the set shown in FIG. 5A or FIG. 5B.

In summary, some embodiments include: 1) Crown detection scanner and image camera that analyze the boards from gantry 308 or a fixed table (such as flip table 380), optionally including lasers and/or scanners and/or cameras for detecting size and number of pieces and length and color and grade marks of the boards; 2) a bar-code scanner system that correlates the original pack (the wrapped pile of lumber) and the cart to which the pile was loaded, in order that the cart bar code can be used to look up the bar code of the wrapper; 3) an OCR or other optical text reader that determines the grade(s) of the boards; and/or 4) a vertical wood runner (such as system 501 or 502) that uses vertically stacked bunks 528.

In some embodiments, the present invention provides a system that includes a computer processor that includes: a plurality of input data devices, a plurality of output data devices, and a plurality of sensors; and a mechanical assembly integrated with the computer processor to reposition a piece of wood lumber based on software code executing in the computer processor. In some embodiments, the system further includes a database operatively coupled to the computer processor.

In some embodiments, the present invention provides a method that operates on a computer processor having a plurality of input data devices, a plurality of output data devices, a plurality of sensors, a database, software code, and a wireless interface, wherein the computer processor is integrated with mechanical components, and wherein the method includes eliciting and receiving into the computer processor data parameters from a first human user; obtaining incoming data points about lumber from the plurality of sensors; processing the data parameters to obtain processed data parameters; storing the processed data parameters; comparing the incoming data points from the plurality of sensors to the stored data parameters to obtain comparison results; and conditionally directing the mechanical components to reject the lumber to a preprogrammed position based on the comparison results.

In some embodiments, the method further includes conditionally directing the mechanical components to feed the lumber into a saw assembly as positioned based on the comparison results. In some embodiments, the method further includes conditionally directing the mechanical components to reposition the lumber to a more optimal position prior to feeding the lumber to a saw assembly based on the comparison results.

In some embodiments, the present invention provides a non-transitory storage medium having computer-executable instructions stored thereon, wherein the instructions, when executed on a suitable computer processor integrated with mechanical components and having a plurality of input data devices, a plurality of output data devices, a plurality of sensors, a database, software code, and a wireless interface, perform a method that includes eliciting and receiving into the computer processor data parameters from a first human user; obtaining incoming data points about lumber from the plurality of sensors; processing the data parameters to obtain processed data parameters; storing the processed data parameters; comparing the incoming data points from the plurality of sensors to the stored data parameters to obtain comparison results; and conditionally directing the mechanical components to reject the lumber to a preprogrammed position based on the comparison results.

In some embodiments, the non-transitory storage medium further includes instructions that cause the method to further include conditionally directing the mechanical components to feed the lumber into a saw assembly as positioned based on the comparison results. In some embodiments, the non-transitory storage medium further includes instructions that cause the method to further include conditionally directing the mechanical components to reposition the lumber to a more optimal position prior to feeding the lumber to a saw assembly based on the comparison results.

In some embodiments, the present invention provides a system for analyzing and manipulating a first piece of lumber, wherein the first piece of lumber is one of a plurality of lumber pieces on a lumber pile, the system including: a gantry structure; a lumber picker operatively coupled to the gantry structure; a lumber flipper; a saw unit; and a lumber-analysis unit operably coupled to the lumber picker, wherein the lumber-analysis unit is configured to analyze defects in the first piece of lumber and generate a lumber-defect result based on the analyzed defects, wherein the lumber picker and gantry structure are configured to move the first piece of lumber from the lumber pile to one of a plurality of destinations that includes the lumber flipper and the saw unit based on the lumber-defect result.

In some embodiments of the system, the lumber-analysis unit is further configured to determine a plurality of dimensions of the first piece of lumber.

In some embodiments of the system, the lumber-analysis unit is configured to analyze crook defects and to determine a crown if a board has a crook defect.

In some embodiments of the system, the lumber-analysis unit is configured to analyze twist defects, wherein the lumber-analysis unit is configured to analyze bow defects, wherein the lumber-analysis unit is configured to analyze knot defects, and wherein the lumber-analysis unit is configured to analyze wane defects.

Some embodiments of the system further include a plurality of vertically spaced-apart lumber bunks, wherein the lumber picker and structure are operatively coupled to pick a selected piece of lumber from a selected one of the plurality of vertically spaced-apart lumber bunks.

Some embodiments of the system further include a sets of lumber bunks, wherein each one of the plurality of sets includes a plurality of vertically spaced-apart lumber bunks, wherein the lumber picker and structure are operatively coupled to pick a selected piece of lumber from a selected one of the plurality of vertically spaced-apart lumber bunks of a selected one of the plurality of sets.

In some embodiments of the system, the lumber-defect result is acceptable such that the lumber picker is configured to pick up the first piece of lumber from the lumber pile and deliver the first piece of lumber to a saw without reorienting the first piece of lumber.

Some embodiments of the system further include a lumber flipper configured to reorient lumber, wherein the lumber-defect result is unacceptable such that the lumber picker is configured to pick up the first piece of lumber from the lumber pile and deliver the first piece of lumber to the flipper.

In some embodiments of the system, the lumber-defect result is unacceptable such that the lumber picker is configured to pick up the first piece of lumber from the lumber pile and deliver the first piece of lumber to a discard pile of lumber.

In some embodiments of the system, the lumber picker includes a plurality of suction cups configured to grasp the first piece of lumber such that the first piece of lumber can be lifted off of the lumber pile and transported.

In some embodiments of the system, the lumber-analysis unit includes one or more optical sensors configured to optically scan the first piece of lumber in order to analyze defects in the first piece of lumber.

In some embodiments of the system, the lumber-analysis unit includes one or more cameras and a processor, wherein the one or more cameras are configured to generate images of the first piece of lumber and electronically transmit the images to the processor, wherein the processor is configured to compare the images to acceptable lumber images.

In some embodiments, the present invention provides an automated method for analyzing and processing lumber that implements the system described above.

In some embodiments, the present invention provides an automated method for analyzing and processing lumber that includes: providing a first plurality of lumber stacks, wherein each one of the first plurality of lumber stacks is vertically displaced relative to at least one other of the first plurality of lumber stacks; selecting a first lumber stack from the first plurality of lumber stacks; inspecting a first lumber piece on the first lumber stack and generating an analysis result based on the inspecting; picking up the first lumber piece from the first lumber stack; and transporting the first lumber piece to a processing location that is chosen based on the analysis result, wherein the transporting moves the first lumber piece in a direction that generally parallels a longitudinal axis of the first lumber stack.

In some embodiments of the method, the analysis result identifies the first lumber piece as unacceptable, and wherein the transporting includes moving the first lumber piece to a discard pile.

In some embodiments of the method, the analysis result identifies the first lumber piece as requiring reorientation, and wherein the transporting includes moving the first lumber piece to a lumber flipper configured to reorient the first lumber piece prior to further processing of the first lumber piece.

In some embodiments of the method, the analysis result identifies the first lumber piece as acceptable, and wherein the transporting includes moving the first lumber piece to a saw station.

Some embodiments of the method further include: providing a second plurality of lumber stacks, wherein each one of the second plurality of lumber stacks is vertically displaced relative to others of the second plurality of lumber stacks, wherein the second plurality of lumber stacks is horizontally displaced relative to the first plurality of lumber stacks, and wherein the transporting includes moving the first lumber piece along a path that runs in between the first plurality of lumber stacks and the second plurality of lumber stacks.

In some embodiments of the method, the inspecting includes measuring a plurality of defect characteristics of the first lumber piece.

In some embodiments of the method, the inspecting includes measuring a plurality of dimensions of the first lumber piece.

Some embodiments of the method further include: providing a processor operatively coupled to a plurality of user devices, a database, and a plurality of sensors; and eliciting and receiving acceptable lumber data from at least one of the plurality of user devices, wherein the inspecting includes gathering physical data of the first lumber piece using the plurality of sensors and storing the physical data in the database, and wherein the generating of the analysis result includes comparing the physical data to the acceptable lumber data using the processor.

Some embodiments of the method further include: after the picking up of the first lumber piece from the first lumber stack, inspecting the first lumber piece from a location below the first lumber piece.

In some embodiments of the method, the picking up of the first lumber piece includes applying a plurality of suction grippers to the first lumber piece.

In some embodiments, the present invention provides an apparatus for automated analysis and processing of lumber, the apparatus including: a first plurality of lumber bunks, wherein each one of the first plurality of lumber bunks is vertically displaced relative to at least one other of the first plurality of lumber bunks, and wherein each bunk is configured to hold a stack of lumber; means for selecting a first lumber stack from the first plurality of lumber bunks; means for inspecting a first lumber piece on the first lumber stack and generating an analysis result based on the inspecting; means for picking up the first lumber piece from the first lumber stack; and means for transporting the first lumber piece to a processing location that is chosen based on the analysis result, wherein the means for transporting moves the first lumber piece in a direction that parallels a longitudinal axis of the first lumber piece.

Some embodiments of the apparatus further include a second plurality of lumber bunks, wherein each one of the second plurality of lumber bunks is vertically displaced relative to others of the second plurality of lumber bunks, wherein the second plurality of lumber bunks is horizontally displaced relative to the first plurality of lumber bunks, and wherein the transporting includes moving the first lumber piece along a path that runs along the first plurality of lumber bunks and the second plurality of lumber bunks.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first, " "second," and "third," etc., are used merely as labels, and are not intended to impose numerical requirements on their objects.

What is claimed is:

1. A system for analyzing and manipulating a first piece of lumber and a second piece of lumber, the system comprising:
   a gantry structure;
   a lumber picker operatively coupled to the gantry structure;
   a saw unit;
   a first plurality of vertically spaced-apart lumber bunks,
      wherein the first piece of lumber is one of a plurality of lumber pieces on a first lumber pile,
      wherein the second piece of lumber is one of a plurality of lumber pieces on a second lumber pile spaced vertically above the first lumber pile,
      wherein the lumber picker and gantry structure are operatively coupled to pick the first piece of lumber from a first selected one of the first plurality of vertically spaced-apart lumber bunks, and
      wherein the lumber picker and gantry structure are operatively coupled to pick the second piece of lumber from a second selected one of the first plurality of vertically spaced-apart lumber bunks; and
   a lumber-analysis unit operably coupled to the lumber picker, wherein the lumber-analysis unit is configured to analyze defects in the first piece of lumber and generate a first lumber-defect result based on the analyzed defects, wherein the lumber picker and gantry structure are configured to move the first piece of lumber from the first lumber pile to one of a plurality of destinations that includes the saw unit based on the first lumber-defect result, and wherein the lumber-analysis unit is configured to analyze defects in the second piece of lumber and generate a second lumber-defect result based on the analyzed defects, and wherein the lumber picker and gantry structure are configured to move the second piece of lumber from the second lumber pile to one of a plurality of destinations that includes the saw unit based on the second lumber-defect result.

2. The system of claim 1, wherein the lumber-analysis unit is further configured to determine a plurality of dimensions of the first piece of lumber.

3. The system of claim 1, wherein the lumber-analysis unit is configured to analyze crook defects and to determine a crown if a board has a crook defect.

4. The system of claim 1, further comprising a second plurality of vertically spaced-apart lumber bunks, wherein the lumber picker and gantry structure are operatively coupled to pick a selected piece of lumber from a selected one of the group consisting of the first plurality of vertically spaced-apart lumber bunks and the second plurality of vertically spaced-apart lumber bunks.

5. The system of claim 4, wherein the lumber-analysis unit is configured to analyze twist defects, wherein the lumber-analysis unit is configured to analyze bow defects, wherein the lumber-analysis unit is configured to analyze knot defects, and wherein the lumber-analysis unit is configured to analyze wane defects.

6. The system of claim 1, wherein the lumber-defect result is acceptable such that the lumber picker is configured to pick up the first piece of lumber from the first lumber pile and deliver the first piece of lumber to a saw without reorienting the first piece of lumber.

7. The system of claim 1, further comprising a lumber flipper configured to reorient lumber, wherein the lumber-defect result is unacceptable such that the lumber picker is configured to pick up the first piece of lumber from the first lumber pile and deliver the first piece of lumber to the flipper.

8. The system of claim 1, wherein the lumber-defect result is unacceptable such that the lumber picker is configured to pick up the first piece of lumber from the first lumber pile and deliver the first piece of lumber to a discard pile of lumber.

9. The system of claim 1, wherein the lumber picker includes a plurality of suction cups configured to grasp the first piece of lumber such that the first piece of lumber can be lifted off of the first lumber pile and transported.

10. The system of claim 1, wherein the lumber-analysis unit includes one or more optical sensors configured to optically scan the first piece of lumber in order to analyze defects in the first piece of lumber.

11. The system of claim 1, wherein the lumber-analysis unit includes one or more cameras and a processor, wherein the one or more cameras are configured to generate images of the first piece of lumber and electronically transmit the images to the processor, wherein the processor is configured to compare the images to acceptable lumber images.

12. An automated method for analyzing and processing lumber comprising:

providing a first plurality of lumber bunks, wherein each one of the first plurality of lumber bunks is vertically displaced relative to at least one other of the first plurality of lumber bunks, wherein each bunk of the first plurality of lumber bunks is configured to hold a stack of lumber;

selecting a first lumber stack from the first plurality of lumber bunks;

inspecting a first lumber piece on the first lumber stack and generating a first analysis result based on the inspecting;

picking up the first lumber piece from the first lumber stack;

transporting the first lumber piece to a processing location that is chosen based on the first analysis result, wherein the transporting includes moving the first lumber piece in a direction that parallels a longitudinal axis of the first lumber stack;

selecting a second lumber stack from the first plurality of lumber bunks;

inspecting a second lumber piece on the second lumber stack and generating a second analysis result based on the inspecting;

picking up the second lumber piece from the second lumber stack; and transporting the second lumber piece to a processing location that is chosen based on the second analysis result, wherein the transporting includes moving the second lumber piece in a direction that parallels a longitudinal axis of the second lumber stack.

13. The method of claim 12, wherein the analysis result identifies the first lumber piece as unacceptable, and wherein the transporting includes moving the first lumber piece to a discard pile.

14. The method of claim 12, wherein the analysis result identifies the first lumber piece as requiring reorientation, and wherein the transporting includes moving the first lumber piece to a lumber flipper configured to reorient the first lumber piece prior to further processing of the first lumber piece.

15. The method of claim 12, wherein the analysis result identifies the first lumber piece as acceptable, and wherein the transporting includes moving the first lumber piece to a saw station.

16. The method of claim 12, further comprising:

providing a second plurality of lumber bunks, wherein each one of the second plurality of lumber bunks is vertically displaced relative to at least one other of the second plurality of lumber bunks, wherein the second plurality of lumber bunks is horizontally displaced relative to the first plurality of lumber bunks, and wherein the transporting includes moving the first lumber piece along a path that runs in between the first plurality of lumber bunks and the second plurality of lumber bunks.

17. The method of claim 12, further comprising:

providing a processor operatively coupled to a plurality of user devices, a database, and a plurality of sensors; and eliciting and receiving acceptable lumber data from at least one of the plurality of user devices, wherein the inspecting includes gathering physical data of the first lumber piece using the plurality of sensors and storing the physical data in the database, and wherein the generating of the analysis result includes comparing the physical data to the acceptable lumber data using the processor.

18. An apparatus for automated analysis and processing of lumber, the apparatus comprising:

a first plurality of lumber bunks, wherein each one of the first plurality of lumber bunks is vertically displaced relative to at least one other of the first plurality of lumber bunks, and wherein each bunk of the first plurality of lumber bunks is configured to hold a stack of lumber;

means for selecting a first lumber stack from the first plurality of lumber bunks;

means for inspecting a first lumber piece on the first lumber stack and generating an analysis result based on the inspecting;

means for picking up the first lumber piece from the first lumber stack;

means for transporting the first lumber piece to a processing location that is chosen based on the analysis result, wherein the means for transporting moves the first lumber piece in a direction that parallels a longitudinal axis of the first lumber piece;

means for selecting a second lumber stack from the first plurality of lumber bunks;

means for inspecting a second lumber piece on the second lumber stack and generating a second analysis result based on the inspecting;

means for picking up the second lumber piece from the second lumber stack;

means for transporting the second lumber piece to a processing location that is chosen based on the second analysis result, wherein the transporting includes moving the second lumber piece in a direction that parallels a longitudinal axis of the second lumber stack.

19. The apparatus of claim 18, further comprising:

a second plurality of lumber bunks, wherein each one of the second plurality of lumber bunks is vertically displaced relative to at least one other of the second plurality of lumber bunks, wherein the second plurality of lumber bunks is horizontally displaced relative to the first plurality of lumber bunks, and wherein the transporting includes moving the first lumber piece along a path that runs along the first plurality of lumber bunks and the second plurality of lumber bunks.

20. The apparatus of claim 18, wherein the means for inspecting the first lumber piece on the first lumber stack includes means for determining a plurality of dimensions of the first lumber piece.

* * * * *